US011594577B2

(12) United States Patent
Lee et al.

(10) Patent No.: US 11,594,577 B2
(45) Date of Patent: Feb. 28, 2023

(54) IMAGE SENSOR AND METHOD OF FABRICATING THEREOF

(71) Applicant: Samsung Electronics Co., Ltd., Suwon-si (KR)

(72) Inventors: Gwi-Deok Ryan Lee, Suwon-si (KR); Jung Hun Kim, Suwon-si (KR); Chang Hwa Kim, Hwaseong-si (KR); Sang Su Park, Seoul (KR); Sang Hoon Uhm, Suwon-si (KR); Beom Suk Lee, Yongin-si (KR); Tae Yon Lee, Seoul (KR); Dong Mo Im, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/520,626

(22) Filed: Nov. 5, 2021

(65) Prior Publication Data

US 2022/0059621 A1 Feb. 24, 2022

Related U.S. Application Data

(63) Continuation of application No. 16/660,799, filed on Oct. 22, 2019, now Pat. No. 11,177,322, which is a
(Continued)

(30) Foreign Application Priority Data

Sep. 25, 2017 (KR) .......................... 10-2017-0123233

(51) Int. Cl.
*H01L 27/30* (2006.01)
*H01L 51/42* (2006.01)
(Continued)

(52) U.S. Cl.
CPC ........ *H01L 27/307* (2013.01); *H01L 27/1463* (2013.01); *H01L 27/14638* (2013.01); (Continued)

(58) Field of Classification Search
CPC ......... H01L 2251/305; H01L 2251/306; H01L 2251/308; H01L 51/4253; H01L 51/442; (Continued)

(56) References Cited

U.S. PATENT DOCUMENTS 6,624,065 B2 9/2003 Jang et al.
8,008,199 B2 8/2011 Baker-O'Neal et al.
(Continued)

FOREIGN PATENT DOCUMENTS

JP 2012165023 A 8/2012
JP 2016152381 A 8/2016
(Continued)

*Primary Examiner* — Monica D Harrison
(74) *Attorney, Agent, or Firm* — Renaissance IP Law Group LLP

(57) ABSTRACT

A color filter is disposed on a substrate. An organic photodiode is disposed on the color filter. The organic photodiode includes an electrode insulating layer having a recess region on the substrate, a first electrode on the color filter, the first electrode filling the recess region of the electrode insulating layer, a second electrode on the first electrode, and an organic photoelectric conversion layer interposed between the first electrode and the second electrode. The first electrode includes a seam extending at a first angle from a side surface of the recess region of the electrode insulating layer.

20 Claims, 30 Drawing Sheets

Related U.S. Application Data continuation of application No. 16/246,431, filed on Jan. 11, 2019, now Pat. No. 10,497,754, which is a continuation of application No. 15/870,947, filed on Jan. 13, 2018, now Pat. No. 10,204,964.

(51) Int. Cl.
*H01L 27/28* (2006.01)
*H01L 51/44* (2006.01)
*H01L 27/146* (2006.01)

(52) U.S. Cl.
CPC .. *H01L 27/14645* (2013.01); *H01L 27/14667* (2013.01); *H01L 27/14689* (2013.01); *H01L 27/286* (2013.01); *H01L 51/4253* (2013.01); *H01L 51/442* (2013.01); *H01L 27/1464* (2013.01); *H01L 27/14621* (2013.01); *H01L 27/14623* (2013.01); *H01L 27/14627* (2013.01); *H01L 27/14647* (2013.01); *H01L 51/447* (2013.01); *H01L 51/448* (2013.01); *H01L 2251/305* (2013.01); *H01L 2251/306* (2013.01); *H01L 2251/308* (2013.01)

(58) Field of Classification Search
CPC ................ H01L 51/447; H01L 51/448; H01L 27/14621; H01L 27/14623; H01L 27/14627; H01L 27/1463; H01L 27/14638; H01L 27/1464; H01L 27/14645; H01L 27/14647; H01L 27/14667; H01L 27/14689; H01L 27/286; H01L 27/307

USPC .......................................................... 257/40
See application file for complete search history.

(56) References Cited

U.S. PATENT DOCUMENTS

| | | | |
|---|---|---|---|
| 8,368,058 B2 * | 2/2013 | Sawaki | B82Y 10/00 257/292 |
| 8,587,040 B2 | 11/2013 | Kobayashi et al. | |
| 8,916,905 B2 | 12/2014 | Kubo et al. | |
| 10,204,964 B1 | 2/2019 | Lee et al. | |
| 2006/0202336 A1 | 9/2006 | Kajita et al. | |
| 2011/0220858 A1 | 9/2011 | Hwang et al. | |
| 2012/0299070 A1 | 11/2012 | Kamada et al. | |
| 2014/0264298 A1 | 9/2014 | Park | |
| 2015/0001663 A1 | 1/2015 | Lee et al. | |
| 2015/0244951 A1 | 8/2015 | Oishi | |
| 2015/0311259 A1 | 10/2015 | Joei | |
| 2016/0035921 A1 | 2/2016 | Matsuda et al. | |
| 2017/0170238 A1 | 6/2017 | Lee et al. | |

FOREIGN PATENT DOCUMENTS

| | | |
|---|---|---|
| KR | 100283109 B1 | 4/2001 |
| KR | 20030000195 A | 1/2003 |
| KR | 20060068490 A | 6/2006 |
| KR | 20070034883 A | 3/2007 |
| KR | 101048489 B1 | 7/2011 |
| KR | 20140113098 A | 9/2014 |
| KR | 20170071183 A | 6/2017 |

* cited by examiner

ID = 10-2017-0123233, filed on Sep. 25, 2017, in the Korean Intellectual Property Office, the disclosure of which is incorporated by reference herein in its entirety.

IMAGE SENSOR AND METHOD OF FABRICATING THEREOF

CROSS-REFERENCE TO RELATED APPLICATION

This application is a continuation of U.S. application Ser. No. 16/660,799 filed Oct. 22, 2019, which is a continuation of U.S. application Ser. No. 16/246,431 filed Jan. 11, 2019, which is a continuation of U.S. patent application Ser. No. 15/870,947, filed on Jan. 13, 2018, which claims priority under 35 U.S.C. § 119 to Korean Patent Application No. 10-2017-0123233, filed on Sep. 25, 2017, in the Korean Intellectual Property Office, the disclosure of which is incorporated by reference herein in its entirety.

TECHNICAL FIELD

The present inventive concept relates to an image sensor and a method of fabricating thereof.

DISCUSSION OF RELATED ART

Image sensors, capturing optical images and converting them to electrical signals, are widely used in cameras installed in cars, security devices, and robots, as well as general consumer electronic devices such as digital cameras, mobile phone cameras, and portable camcorders. Such image sensors are required to be scaled down and to have high resolution, and accordingly various studies are being conducted to meet such needs.

SUMMARY

According to an exemplary embodiment of the present inventive concept, an image sensor is provided as follows. A color filter is disposed on a substrate. An organic photodiode is disposed on the color filter. The organic photodiode includes an electrode insulating layer having a recess region on the substrate, a first electrode on the color filter, the first electrode filling the recess region of the electrode insulating layer, a second electrode on the first electrode, and an organic photoelectric conversion layer interposed between the first electrode and the second electrode. The first electrode includes a seam extending at a first angle from a side surface of the recess region of the electrode insulating layer.

According to an exemplary embodiment of the present inventive concept, an image sensor is provided as follows. A first electrode is disposed on a substrate. An electrode insulating layer surrounds a side surface of the first electrode. A second electrode is disposed on the first electrode. An organic photoelectric conversion layer is interposed between the first electrode and the second electrode. The first electrode includes a first region, a second region and a seam, the seam dividing the first electrode into the first region and the second region. The first region and the second region are discontinuous across the seam. The first region has a decreasing width toward the organic photoelectric conversion layer, and the second region has an increasing width toward the organic photoelectric conversion layer.

According to an exemplary embodiment of the present inventive concept, a method of fabricating an image sensor is provided as follows. A color filter is formed on a substrate. A capping insulating layer is formed on the color filter. An electrode insulating layer having a recess region is formed on the capping insulating layer. The recess region has a first side surface inclined at a first angle ($\theta_R$) with respect to a lower surface of the recess region. A first preliminary electrode having a seam is formed in the recess region of the electrode insulating layer. The seam is extended in the recess region at a second angle ($\theta_{GB}$) with respect to the lower surface of the recess region. The first preliminary electrode is planarized to form a first electrode having the seam. An organic photoelectric conversion layer is formed on the first electrode. A second electrode is formed on the organic photoelectric conversion layer.

According to an exemplary embodiment of the present inventive concept, a method of fabricating an image sensor is provided as follows. An electrode insulating layer having a recess region is formed on a substrate. The recess region has a lower surface and a first side surface, the first side surface being inclined at a first angle ($\theta_R$) with respect to the lower surface of the recess region. A first preliminary electrode having a seam is grown in the recess region of the electrode insulating layer. The seam is extended in the recess region at a second angle ($\theta_{GB}$) with respect to the lower surface of the recess region. A first region of the first preliminary electrode is grown on the lower surface of the recess region in a first direction. A second region of the first preliminary electrode is grown on the first side surface of the recess region in a second direction crossing the first direction. The seam is formed at a region where the first region and the second region meet each other in the forming of the first preliminary electrode. The first preliminary electrode includes ITO, ZnO, SnO$_2$, TiO$_2$, ZITO, IZO, GIO, ZTO, FTO, AZO, or GZO.

BRIEF DESCRIPTION OF DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
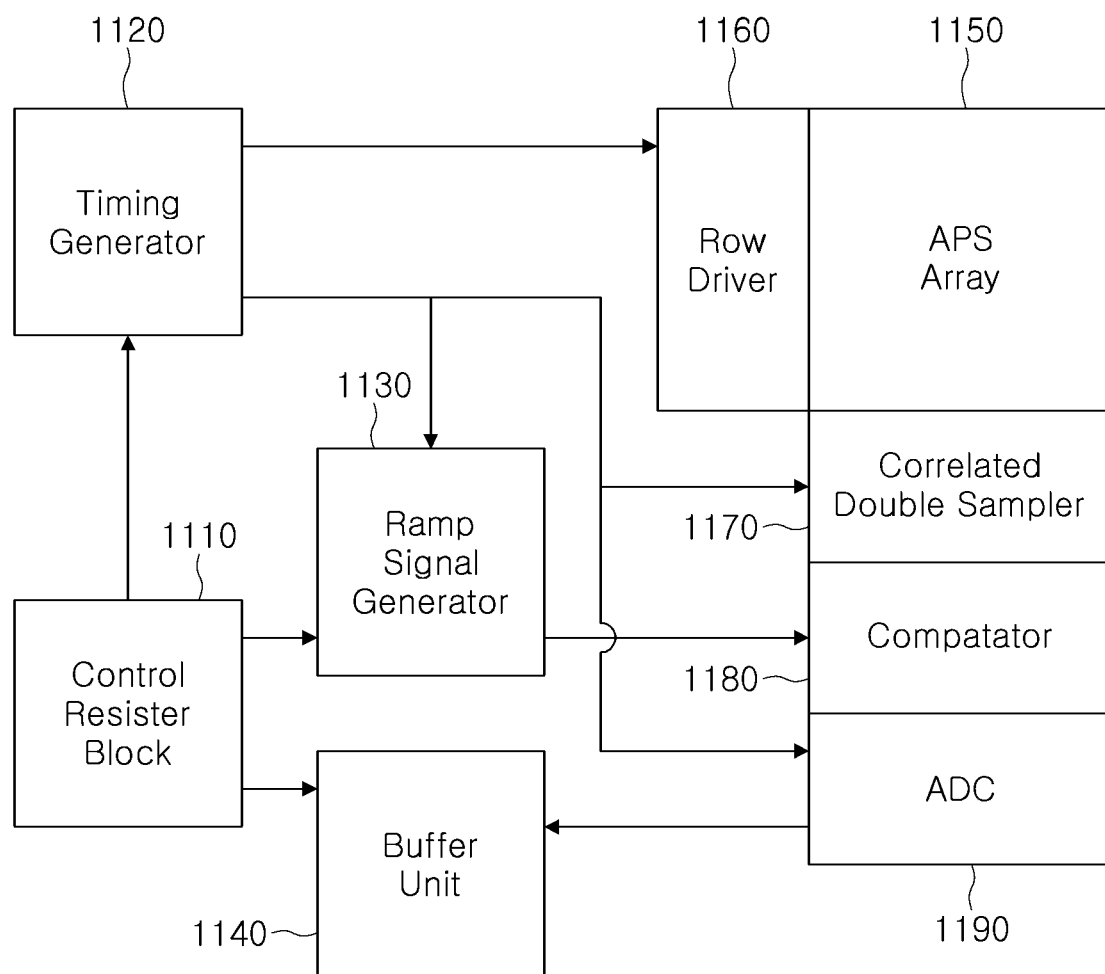
FIG. 1 is a schematic block diagram of an image sensor according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

FIG. 1 is a schematic block diagram of an image sensor according to an exemplary embodiment of the present inventive concept.

Referring to FIG. 1, an image sensor 1000 may include a control register block 1110, a timing generator 1120, a ramp signal generator 1130, a buffer unit 1140, an active pixel sensor (APS) array 1150, a row driver 1160, a correlated double sampler 1170, a comparator 1180, and an analog-digital converter (ADC) 1190.

The control register block 1110 may control the overall operations of the image sensor 1000. For example, the control register block 1110 may directly transmit an operation signal to the timing generator 1120, the ramp signal generator 1130, and the buffer unit 1140. The timing generator 1120 may generate an operation timing reference signal for various components of the image sensor 1000. The operation timing reference signal generated in the timing generator 1120 may be transmitted to the ramp signal generator 1130, the row driver 1160, the correlated double sampler 1170, or the analog-digital converter 1190. The ramp signal generator 1130 may generate and transmit a ramp signal used in the correlated double sampler 1170 or the comparator 1180. The buffer unit 1140 may include a latch. The buffer unit 1140 may temporarily store an image signal to be transmitted externally, and may transmit image data to an external device.

The APS array 1150 may sense an external image. The APS array 1150 may include a plurality of active pixels. The row driver 1160 may selectively activate a row of the APS array 1150. The correlated double sampler 1170 may sample and output an analog signal generated in the APS array 1150. The comparator 1180 may generate various reference signals by comparing a slope, or the like, of ramp signals given feedback according to data transmitted from the correlated double sampler 1170 and analog reference voltages thereof. The analog-digital converter 1190 may convert analog image data into digital image data.

Figure 2:
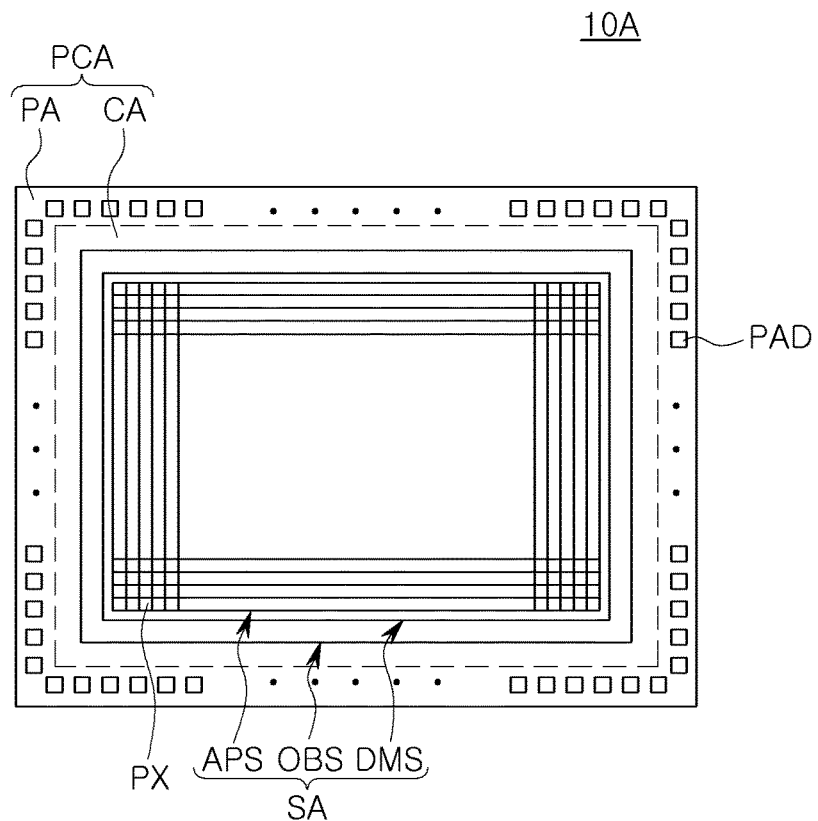
FIG. 2 is a diagram illustrating a schematic layout of an image sensing device according to an exemplary embodiment of the present inventive concept.

FIG. 2 is a diagram illustrating a schematic layout of an image sensing device according to an exemplary embodiment of the present inventive concept.

Referring to FIG. 2, an image sensor 10A may include a sensor array region SA and a peripheral circuit region PCA arranged around the sensor array region SA.

The sensor array region SA may include an active pixel sensor area APS including active pixels that generate active signals corresponding to wavelengths of external light, an optical black sensor area OBS including optical black pixels that generate optical black signals by blocking external light, and a dummy pixel sensor area DMS arranged between the active pixel sensor area APS and the optical black sensor area OBS. The dummy pixel sensor area DMS may include dummy pixels that do not output an electrical signal.

The active pixel sensor area APS may be an area corresponding to the APS array 1150 described above with reference to FIG. 1. The active pixel sensor area APS may include a plurality of pixel areas PX arranged in a matrix form. Each of the pixel areas PX may include a photoelectric conversion device such as a photodiode, and transistors.

The peripheral circuit region PCA may include a circuit area CA having a plurality of circuits, and a pad area PA having a plurality of pads PAD arranged around the circuit area CA.

The circuit area CA may include a plurality of complementary metal oxide semiconductor (CMOS) transistors, and send a constant signal to each of the pixel areas PX of the sensor array region SA or control an output signal output from each of the pixel areas PX of the sensor array region SA. The circuit area CA may include areas corresponding to the control register block 1110, the timing generator 1120, the ramp signal generator 1130, the buffer unit 1140, the row driver 1160, the correlated double sampler 1170, the comparator 1180, and the analog-digital converter 1190, described above with reference to FIG. 1.

The plurality of pads PAD of the pad area PA may transmit or receive an electric signal to or from an external device or the like. The plurality of pads PAD may transmit external driving power, such as a supply voltage or a ground voltage, to circuits arranged in the circuit area CA.

Figures 3A, 3B:
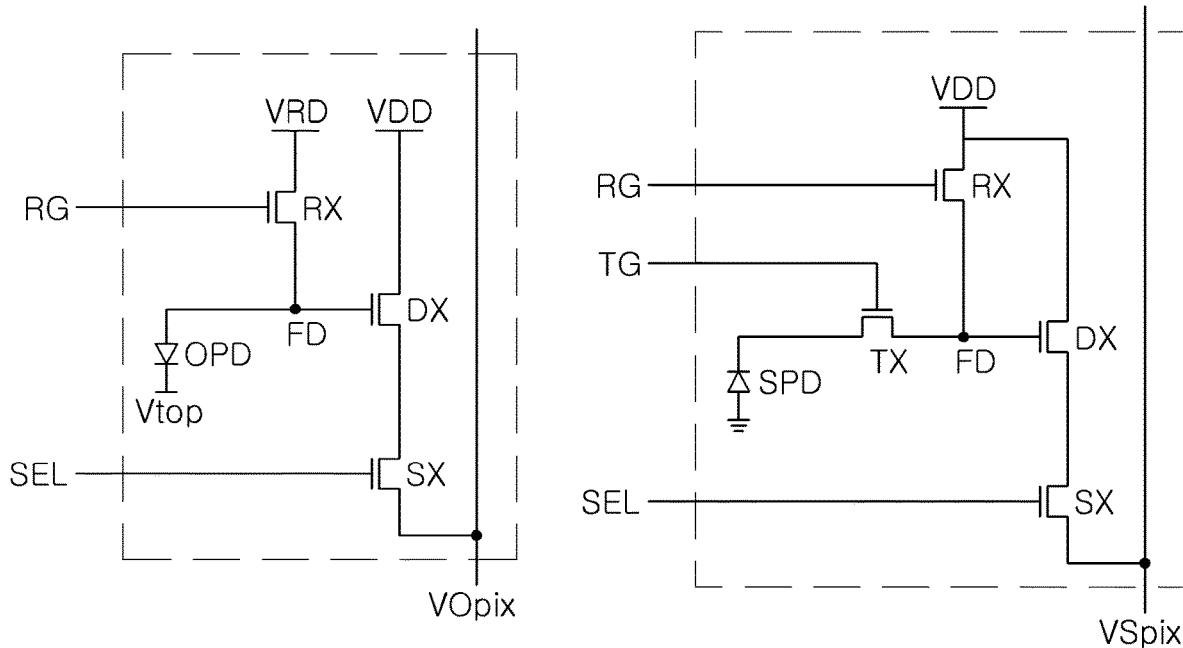
FIGS. 3A and 3B are circuit diagrams illustrating pixel circuits of image sensors according to an exemplary embodiment of the present inventive concept.

FIGS. 3A and 3B are circuit diagrams illustrating pixel circuits of image sensors according to an exemplary embodiment of the present inventive concept.

Each pixel area PX described above with reference to FIG. 2 may include two or more photoelectric conversion devices, and the two or more photoelectric conversion devices included in the pixel areas PX may receive light of different colors to generate electric charges. When each of the pixel areas PX has two or more photoelectric conversion devices, each of the pixel areas PX may include pixel circuits to process electric charges generated in each photoelectric conversion device.

Referring to FIG. 3A, the pixel circuit may be a circuit that generates an electric signal using electric charges generated in an organic photodiode OPD.

The pixel circuit may include a plurality of transistors and have a three transistor (3T) circuit structure. For example, the pixel circuit may include a reset transistor RX, a drive transistor DX, and a select transistor SX. A gate terminal of the drive transistor DX may be connected to a floating diffusion FD, and electric charges generated in the organic photodiode OPD may be accumulated in the floating diffusion FD. The organic photodiode OPD may include first and second electrodes disposed in parallel with each other, and an organic light conversion layer disposed therebetween. The organic light conversion layer may receive light in a predetermined wavelength band to generate electric charges.

The drive transistor DX may be operated as a source follower buffer amplifier by the electric charges accumulated in the floating diffusion FD. The drive transistor DX may amplify the electric charges accumulated in the floating diffusion FD to be transmitted to the select transistor SX.

The select transistor SX may be operated by a select control signal SEL input by a row driver, and perform switching and addressing operations. When the select control signal SEL is applied by the row driver, a first pixel signal VOpix may be output to a first column line connected to the select transistor SX. The first pixel signal VOpix may be detected by a column driver and a readout circuit.

The reset transistor RX may be operated by a reset control signal RG input by the row driver. Due to the reset control signal RG, the reset transistor RX may reset a voltage of the floating diffusion FD to a readout voltage VRD.

The organic photodiode OPD may use holes as major charge carriers. When the holes are used as the major charge carriers, a cathode of the organic photodiode OPD may be connected to the floating diffusion FD, and an anode of the organic photodiode OPD may be connected to a top electrode voltage Vtop. The top electrode voltage Vtop may be a positive voltage of several volts, for example, 3.0 V or so. Since holes are generated as the major charge carriers in the organic photodiode OPD, a drain terminal of the reset transistor RX may be connected to the readout voltage VRD having a different value from a power supply voltage VDD. Since the pixel circuit is implemented to use holes as the major charge carriers, dark current properties may be improved. In some example embodiments, the organic photodiode OPD may generate electrons as the major charge carriers, and have a circuit structure corresponding thereto.

Referring to FIG. 3B, the pixel circuit may be a circuit that generates an electric signal by using electric charges generated in a semiconductor photodiode SPD.

The pixel circuit may be a 4T circuit including four transistors. For example, the pixel circuit may include a reset transistor RX, a drive transistor DX, a select transistor SX, and a transfer transistor TX. The semiconductor photodiode SPD connected to the pixel circuit may be a semiconductor photodiode formed on a semiconductor substrate including silicon or the like, and may be connected to a floating diffusion FD through the transfer transistor TX. For example, a cathode or anode of the semiconductor photodiode SPD need not be directly connected to the floating diffusion FD, in contrast to the exemplary embodiment described above with reference to FIG. 3A.

The transfer transistor TX may transmit electric charges accumulated in the semiconductor photodiode SPD to the floating diffusion FD, based on a transfer control signal TG transmitted from a row driver. The semiconductor photodiode SPD may generate electrons as major charge carriers. Operations of the reset transistor RX, the drive transistor DX, and the select transistor SX may be similar to those described above with reference to FIG. 3A, and a second pixel signal VSpix may be output through a second column line connected to the select transistor SX. The second pixel signal VSpix may be detected by a column driver and a readout circuit.

Figure 4:
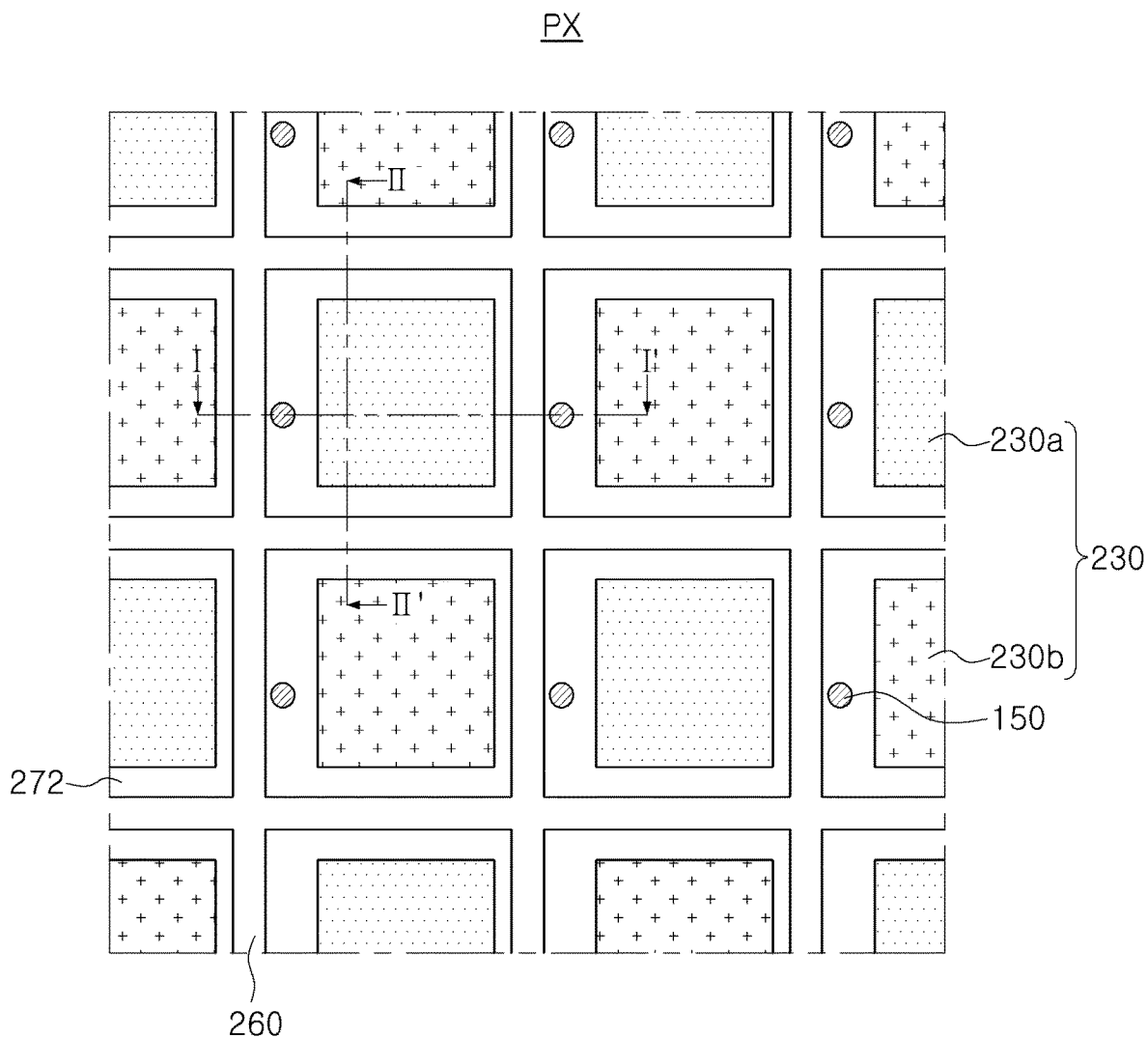
FIG. 4 is a schematic plan view illustrating a pixel area of an image sensor according to an exemplary embodiment of the present inventive concept.

FIG. 4 is a schematic plan view illustrating a pixel area of an image sensor according to an exemplary embodiment of the present inventive concept.

Figure 5A:
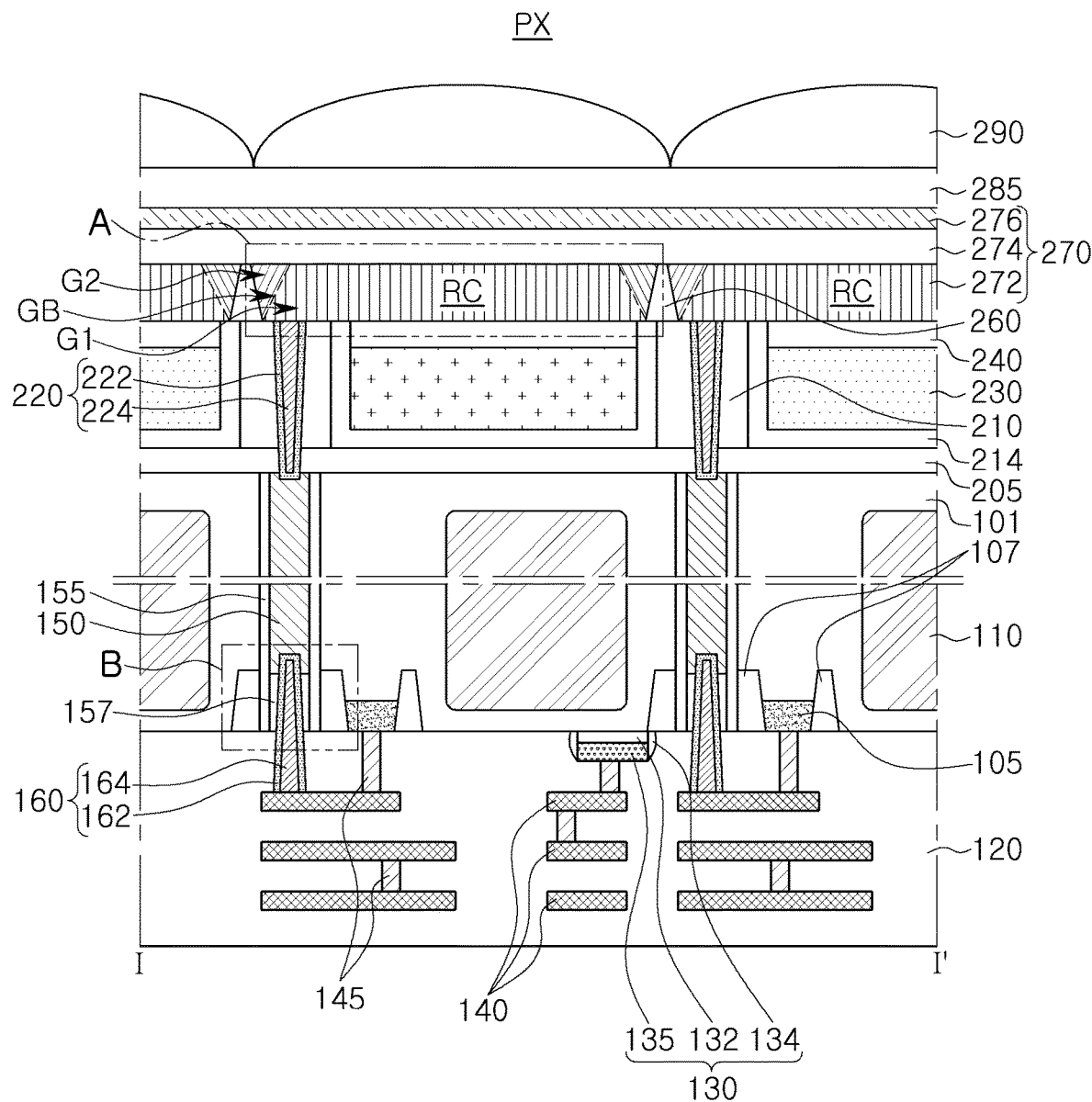
FIGS. 5A and 5B are schematic cross-sectional views illustrating pixel areas of an image sensor according to an exemplary embodiment of the present inventive concept.
Figure 5B:
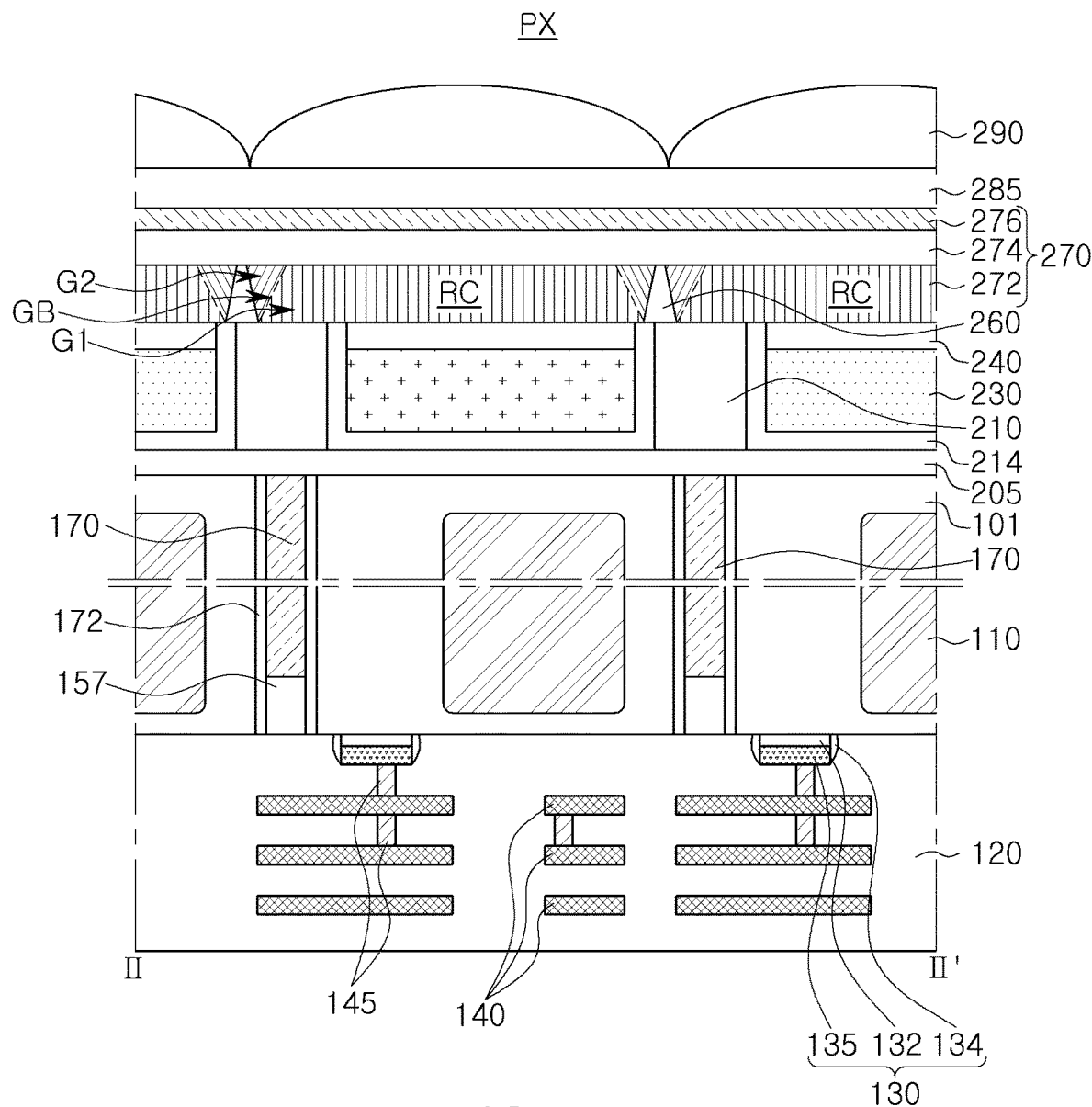

FIGS. 5A and 5B are schematic cross-sectional views illustrating pixel areas of image sensors according to an exemplary embodiment of the present inventive concept. FIGS. 5A and 5B respectively illustrate cross-sectional areas taken along lines I-I' and II-II' in FIG. 4. Throughout this disclosure, directional terms such as "upper," "upper portion," "upper surface," "lower," "lower portion," "lower surface," "side surface," and the like, may be relative terms based on the drawings, unless described otherwise.

Referring to FIGS. 4 to 5B, the pixel area PX may include storage node regions 105, device isolation regions 107, photodiodes 110, and contact vias 150, disposed in a substrate 101. The pixel area PX may further include an interlayer insulating layer 120, pixel circuit devices 130, interconnection layers 140, interconnection vias 145, and first contact plugs 160, disposed on a lower surface of the substrate 101. The pixel area PX may further include an antireflective layer 205, an upper insulating layer 210, filter insulating layers 214, second contact plugs 220, color filters 230, capping insulating layers 240, electrode insulating layers 260, organic photodiodes 270, a cover insulating layer 285, and microlenses 290, disposed on an upper surface of the substrate 101.

The storage node regions 105 may be disposed to be spaced apart from the photodiodes 110 by the device isolation regions 107 in the substrate 101. The storage node regions 105 may include impurities having a different conductivity type from the substrate 101. For example, the substrate 101 may include p-type impurities, and the storage node regions 105 may include n-type impurities. The storage node regions 105 may be areas corresponding to the floating diffusion FD described above with reference to FIGS. 3A and 3B.

The device isolation regions 107 may be arranged to extend from the lower surface of the substrate 101 into the substrate 101 and may be formed of an insulating material.

The photodiodes 110 may be photoelectric conversion devices in the substrate 101, and absorb incident light to generate and accumulate electric charges corresponding to the amount of the light. The photodiodes 110 may correspond to the semiconductor photodiode SPD described above with reference to FIG. 3B. The photodiodes 110 may include impurities having a different conductivity type from the substrate 101. The photodiodes 110 may form a PN junction with the substrate 101 or a well region of the substrate 101.

The contact vias 150 may be arranged to pass through the upper and lower surfaces of the substrate 101. The contact vias 150 may pass through the device isolation regions 107 in areas adjacent to the lower surface of the substrate 101. Lower portions of the contact vias 150 may be connected to the first contact plugs 160, and upper portions of the contact vias 150 may be connected to the second contact plugs 220. Through the contact vias 150, first electrodes 272 may be electrically connected to the interconnection layers 140 formed in the interlayer insulating layer 120. The contact vias 150 may be formed of a conductive material such as polysilicon. The contact vias 150 may be electrically isolated from the substrate 101 and the photodiodes 110 by via insulating layers 155. The via insulating layers 155 may be formed of an insulating material, such as silicon oxide and silicon nitride.

In an exemplary embodiment, the contact vias 150 penetrating the substrate 101 may be in contact with the second contact plugs 220.

The interlayer insulating layer 120 may be formed of an insulating material in a single layer or in a plurality of layers. For example, the interlayer insulating layer 120 may include silicon oxide or silicon nitride. In some example embodiments, a support layer may be additionally disposed on a lower surface of the interlayer insulating layer 120 to secure the strength of the substrate 101.

The pixel circuit devices 130 may be disposed between the interconnection layers 140 and the photodiodes 110 on the lower surface of the substrate 101. The pixel circuit devices 130 may correspond to the pixel circuit described above with reference to FIGS. 3A and 3B. The pixel circuit devices 130 may include a circuit insulating layer 132, a spacer layer 134, and a circuit electrode layer 135.

The interconnection layers 140 and the interconnection vias 145 may be arranged in the interlayer insulating layer 120 to be electrically connected to the storage node regions 105 and photodiodes 110 formed in the substrate 101. The interconnection layers 140 may be disposed to be parallel to the lower surface of the substrate 101. The interconnection vias 145 may be disposed to be perpendicular to the lower surface of the substrate 101 and have a cylindrical shape or a circular truncated cone shape. The interconnection layers 140 and the interconnection vias 145 may be formed of a conductive material. For example, the interconnection layers 140 and the interconnection vias 145 may include at least one of tungsten (W), copper (Cu), aluminum (Al), gold (Au), silver (Ag), and alloys thereof. The number of layers of the interconnection layers 140, and the number and locations of the interconnection vias 145 are not limited to those illustrated in the drawings.

The first contact plugs 160 may be arranged to connect the contact vias 150 to the interconnection layers 140. The first contact plugs 160 may extend into the contact vias 150. Upper surfaces of the first contact plugs 160 may be disposed higher than upper surfaces of the device isolation regions 107, but the present inventive concept is not limited thereto. The first contact plugs 160 may be partly surrounded by a buried insulating layer 157. The buried insulating layer 157 may be formed of an insulating material, such as silicon oxide and silicon nitride. The first contact plugs 160 may include a first barrier layer 162 and a first conductive layer 164. The first barrier layer 162 may function as a diffusion barrier layer. The first barrier layer 162 may include, for example, tungsten nitride (WN), tantalum nitride (TaN), titanium nitride (TiN), or combinations thereof. The first conductive layer 164 may include a conductive material. For example, the first conductive layer 164 may include at least one of tungsten (W), copper (Cu), aluminum (Al), gold (Au), silver (Ag), and alloys thereof.

The refractive index of the antireflective layer 205 may have high transmittance so that external light incident on the upper surface of the substrate 101 may travel to the photodiodes 110. The antireflective layer 205 may be formed of, for example, SiON, SiC, SICN, or SiCO.

The upper insulating layer 210 may be disposed between the second contact plugs 220 and the color filters 230. The filter insulating layers 214 may be disposed to cover lower and side surfaces of the color filters 230. The capping insulating layers 240 may be disposed on upper surfaces of the color filters 230. The upper insulating layer 210, the filter insulating layers 214, and the capping insulating layers 240 may be formed of an insulating material such as silicon oxide. In some example embodiments, each of the upper insulating layer 210, filter insulating layers 214, and capping insulating layers 240 may be formed in a plurality of layers. In some example embodiments, the upper insulating layer 210 and the filter insulating layers 214 may be formed in a single layer.

The second contact plugs 220 may be arranged to connect the contact vias 150 to the first electrodes 272. The second contact plugs 220 may extend into the contact vias 150, and upper surfaces of the second contact plugs 220 may be coplanar with upper surfaces of the capping insulating layers 240. The second contact plugs 220 may include a second barrier layer 222 and a second conductive layer 224. The second barrier layer 222 may function as a diffusion barrier layer, and may include, for example, tungsten nitride (WN), tantalum nitride (TaN), titanium nitride (TiN), or combinations thereof. The second conductive layer 224 may include a conductive material. For example, the second conductive layer 224 may include at least one of tungsten (W), copper (Cu), aluminum (Al), gold (Au), silver (Ag), and alloys thereof.

The color filters 230 may be disposed on the filter insulating layers 214. The color filters 230 may be disposed above the photodiodes 110. The color filters 230 may transmit light of a specific wavelength band to the photodiodes 110 disposed therebelow. As illustrated in FIG. 4, the color filters 230 may include first color filters 230a and second color filters 230b arranged alternately in a row direction and a column direction. For example, the first color filters 230a may be red color filters, and the second color filters 230b may be blue color filters. In this case, the first color filters 230a may transmit light in a red wavelength band to photodiodes 110 disposed therebelow and overlapped thereby, and the second color filters 230b may transmit light in a blue wavelength band to photodiodes 110 disposed therebelow and overlapped thereby. The color filters 230 may be formed of a material formed by mixing a resin with a pigment including a metal or a metal oxide, for example.

The electrode insulating layer 260 may be disposed to surround side surfaces of the first electrodes 272 on the color filters 230. As illustrated in FIG. 4, the electrode insulating layer 260 may have a structure connected between the first electrodes 272 arranged in rows and columns. The electrode insulating layer 260 may include recess regions RC respectively arranged in pixel areas and accommodating the first electrodes 272. The recess regions RC may be arranged above the photodiodes 110 and the color filters 230. In the example embodiment of the present inventive concept, side surfaces of the recess regions RC may be defined by the electrode insulating layer 260, and lower surfaces of the recess regions RC may be defined by the upper insulating layer 210, the filter insulating layers 214, the capping insulating layers 240, and the second contact plugs 220. The electrode insulating layer 260 may have a shape in which a width decreases upwardly and thereby an upper surface is narrower than a lower surface between the first electrodes 272, but present inventive concept is not limited thereto. The electrode insulating layer 260 may be formed of an insulating material such as silicon oxide and silicon nitride.

The organic photodiodes 270 may be disposed above the color filters 230. The organic photodiodes 270 may receive light having a different color from light the photodiodes 110 receive, and generate electric charges. The organic photodiodes 270 may be the organic photodiodes OPD described above with reference to FIG. 3A. The organic photodiodes 270 may include first electrodes 272 and second electrodes 276 facing each other, and a photoelectric conversion layer 274 disposed therebetween.

The photoelectric conversion layer 274 may be an organic photoelectric conversion layer including an organic material. The photoelectric conversion layer 274 may include a p-type layer in which major carriers are holes, or an n-type layer in which major carriers are electrons. The photoelectric conversion layer 274 may generate electric charges in response to light in a specific wavelength band. For example, the photoelectric conversion layer 274 may generate electric charges in response to light in a green wavelength band. In this case, light having a color other than the green color may be transmitted to the photodiodes 110 disposed below the photoelectric conversion layer 274 through the color filters 230. The photoelectric conversion layer 274 may be formed in a single layer or a multilayer. For example, the photoelectric conversion layer 274 may be formed of an intrinsic layer (I layer), or a variously combined structure, such as p-type layer/I layer, I layer/n-type layer, p-type layer/I layer/n-type layer, or p-type layer/n-type layer.

The first electrodes 272 may be disposed in the recess regions RC defined by the electrode insulating layer 260. As illustrated in FIG. 4, the first electrodes 272 may be respectively disposed above the color filters 230. The first electrodes 272 may be respectively disposed to be offset from centers of the color filters 230 in a certain direction, but the present inventive concept is not limited thereto. The first electrodes 272 may have a crystalline structure including a plurality of grains. The first electrodes 272 may have seams extending obliquely with respect to side and lower surfaces of the recess regions RC. This will be described in more detail with reference to FIGS. 7A and 7B. The photoelectric conversion layer 274 may be disposed in a single layer on the first electrodes 272. The second electrodes 276 may be disposed in a single layer on the photoelectric conversion layer 274.

The first electrodes 272 and the second electrodes 276 may be formed of a transparent conductive material, such as indium tin oxide (ITO), ZnO, SnO$_2$, TiO$_2$, zinc-doped indium tin oxide (ZITO), indium zinc oxide (IZO), gallium indium oxide (GIO), zinc tin oxide (ZTO), fluorine-doped tin oxide (FTO), aluminum-doped zinc oxide (AZO), and gallium-doped zinc oxide (GZO), or a translucent material such as a metal thin film. In some example embodiments, the second electrodes 276 may be formed of a material having a work function greater than or the same as that of the first electrodes 272, but the present inventive concept is not limited thereto.

The cover insulating layer 285 may be disposed on the organic photodiode 270. The cover insulating layer 285 may be formed of an insulating material, such as silicon oxide and silicon oxynitride.

The microlenses 290 may concentrate light into the photodiodes 110 by changing a path of light incident on areas other than the photodiodes 110. The microlenses 290 may be formed of, for example, a TMR-based resin (a product by Tokyo Ohka Kogyo Co.) or an MFR-based resin (a product by Japan Synthetic Rubber Co.).

As illustrated in FIG. 5B, pixel isolation regions 170 may be respectively arranged at boundaries of the pixel areas in the substrate 101. The pixel isolation regions 170 may be arranged to surround the photodiodes 110. However, the pixel isolation regions 170 need not be formed around areas in which the contact vias 150 are formed. In some example embodiments, relative arrangements of the pixel isolation regions 170 and the photodiodes 110 are not limited to those in the drawings, and may be variously modified. For example, lower surfaces of the pixel isolation regions 170 may be disposed to be higher or lower than lower surfaces of the photodiodes 110. The buried insulating layer 157 may be disposed below the pixel isolation regions 170. The pixel isolation regions 170 may be formed of, for example, polysilicon. In this case, the pixel isolation regions 170 may be electrically isolated from the substrate 101 by a pixel isolation insulating layer 172. Alternatively, in some example embodiments, the pixel isolation regions 170 may be formed of an insulating material.

In an exemplary embodiment, the upper insulating layer 210 may surround side surfaces of the color filters 230. The second contact plugs 220 may penetrate the upper insulating layer 210 so that one of the second contact plugs 220 is in contact with one of the first electrodes 272. For example, the second contact plugs 220 penetrating the upper insulating layer 210 may be in contact with the first electrodes 272.

In an exemplary embodiment, the contact vias 150 may penetrate the substrate to be in contact with the second contact plugs 220.

Figure 6:
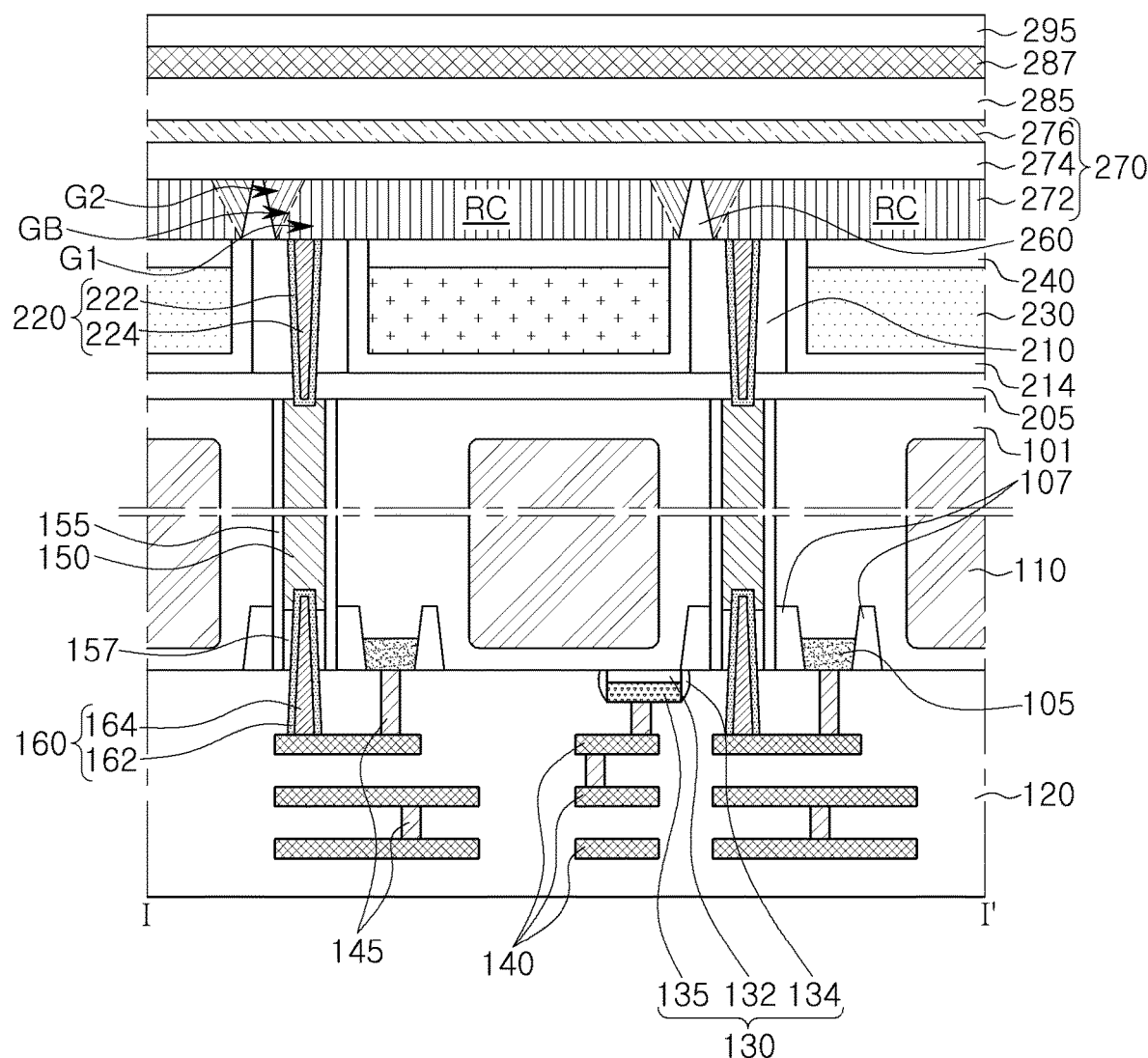
FIG. 6 is a schematic cross-sectional view of an optical black pixel area OBPX of an image sensor according to an exemplary embodiment of the present inventive concept.

FIG. 6 is a schematic cross-sectional view of an optical black pixel area OBPX of an image sensor according to an exemplary embodiment of the present inventive concept.

Referring to FIG. 6, the optical black pixel area OBPX may include a light-blocking layer 287 and a passivation layer 295, instead of the microlenses 290, on the cover insulating layer 285, unlike the pixel area PX described above with reference to FIGS. 4 to 5B.

The light-blocking layer 287 may be disposed on the entire area of the optical black sensor area OBS illustrated in FIG. 2, and may extend to at least a portion of the circuit area CA or the pad area PA. The light-blocking layer 287 may include a light-blocking material. For example, the light-blocking layer 287 may be formed of a metal material, such as tungsten (W), copper (Cu), aluminum (Al), gold (Au), silver (Ag), and combinations thereof. Alternatively, the light-blocking layer 287 may have a structure in which the plurality of color filters 230 described above with reference to FIGS. 4 to 5B are stacked. The passivation layer 295 may be disposed on the light-blocking layer 287. The passivation layer 295 may be formed of, for example, silicon oxide, silicon nitride, or a metal oxide.

A dummy pixel area, disposed in the dummy pixel sensor area DMS described above with reference to FIG. 2, may have the same structure as the optical black pixel area OBPX or the pixel area PX. When the dummy pixel area has the same structure as the pixel area PX, the operation timing reference signal generated in the timing generator 1120, described above with reference to FIG. 1, may not be applied to the dummy pixel area.

Figure 7A:
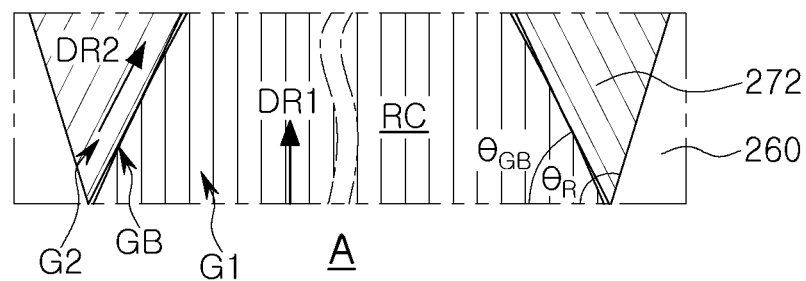
FIGS. 7A and 7B are cross-sectional views schematically illustrating portions of image sensors according to an exemplary embodiment of the present inventive concept.
Figure 7B:
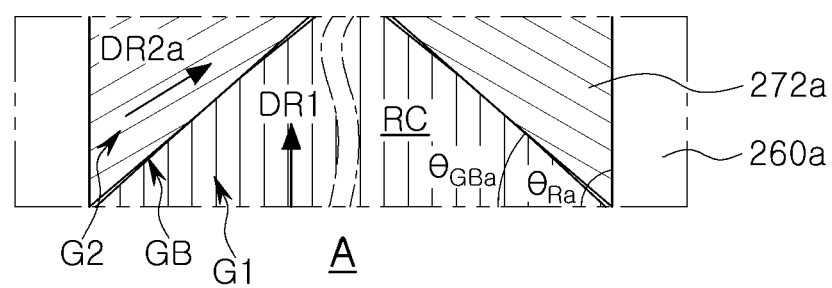

FIGS. 7A and 7B are cross-sectional views schematically illustrating portions of image sensors according to an exemplary embodiment of the present inventive concept. In FIGS. 7A and 7B, a region corresponding to area A of FIG. 5A is illustrated.

The first contact plugs 160 may be referred to as lower contact plugs, and the second contact plugs 220 may be referred to as upper contact plugs.

Referring to FIG. 7A, the area A of FIG. 5A is illustrated as enlarged. Each of the first electrodes 272 may include a first region G1 grown from a lower surface of the recess region RC, and second regions G2 grown side surfaces of the recess region RC, for example, side surfaces of the electrode insulating layer 260.

Each of first electrodes 272 may have a quadrangular pyramidal frustum shape having a lower surface smaller than an upper surface. The first region G1 may have a quadrangular pyramidal frustum shape having a lower surface greater than an upper surface, or a similar shape thereto. For example, while the first region G1 has the quadrangular pyramidal frustum shape, each surface of the first region G1 may be curved rather than completely flat. In addition, edges of the first region G1 may be smoothened rather than completely straight. The second regions G2 may have a triangular pyramidal shape or a similar shape. Each of the first electrodes 272 may include, for example, five regions including one first region G1 and four second regions G2, but the present inventive concept is not limited thereto.

A seam GB may be disposed to extend from a lower part of one of the first electrode 272 to an upper part of the one of the first electrodes 272. The seam GB disposed between the first region G1 and one of the second regions G2 may obliquely extend from a lower corner of the recess region RC or lower ends of the side surfaces of the electrode insulating layer 260 toward an upper surface of the one of the first electrodes 272. The seam GB may extend between the lower surface and the side surfaces of the recess region RC. This is because the first region G1 and the second regions G2 grow in different directions from each other to collide or meet to each other. For example, the seam GB may be formed at a region where the first region G1 and one of the second regions G2 collide or meet each other. However, in some example embodiments, the seam GB may extend from a portion adjacent to the corner between the lower surface and the side surfaces of the recess region RC, rather than from the exact corner between the lower surface and the side surfaces of the recess region RC.

The first region G1 may be grown from the lower surface of the recess region RC in a first direction DR1, and the second regions G2 may be grown from the side surfaces of the electrode insulating layer 260 in a second direction DR2. The first direction DR1 may form a larger angle than the second direction DR2, with respect to the lower surface of the recess region RC. When the first electrodes 272 are formed of indium tin oxide (ITO), the first direction DR1 and the second direction DR2 may be the <222> orientation and the regions may be grown in the {222} plane. When an angle formed by the lower surface and the side surfaces of the recess region RC is denoted by a first angle $\theta_R$ and an angle formed by the seam GB and the lower surface of the recess region RC is denoted by a second angle $\theta_{GB}$, $0.3\theta_R \leq \theta_{GB} \leq 0.8\theta_R$, particularly, $0.5\theta_R \leq \theta_{GB} \leq 0.8\theta_R$, may be satisfied. For example, the first angle $\theta_R$ and the second angle $\theta_{GB}$ may satisfy the following relation: $0.3\theta_R \leq \theta_{GB} \leq 0.8\theta_R$, particularly, $0.5\theta_R \leq \theta_{GB} \leq 0.8\theta_R$. However, the present inventive concept is not limited thereto.

Since the seam GB is formed at each ends of one of the first electrodes 272, resistance may increase at the edge portions of the first electrode 272, thereby decreasing an electric field at the edge portions. As a result, pixel-to-pixel crosstalk may be reduced.

Referring to FIG. 7B, the area A of FIG. 5A is illustrated according to an exemplary embodiment of the present inventive concept. An angle $\theta_{Ra}$ formed by the lower surface and the side surfaces of the recess region RC may be smaller than the angle $\theta_R$ described with reference to FIG. 7A. That is, the side surfaces of the electrode insulating layer 260 may be disposed to be more perpendicular to a surface of the substrate 101 than those illustrated in FIG. 7A. In this case, an angle $\theta_{Gba}$ formed by the seam GB and the lower surface of the recess region RC may also be relatively reduced. Accordingly, a second direction DR2a, a growth direction of the second regions G2, may be changed to be more horizontal than the second direction DR2 illustrated in FIG. 7A.

The angle $\theta_{Gba}$ formed by the seam GB and the lower surface of the recess region RC may be modified by changing an angle of the side surfaces of the electrode insulating layer 260, and may be selected in consideration of a size of each of the first electrodes 272, a distance between the first electrodes 272, and the incidence of pixel-to-pixel crosstalk.

Figure 8:
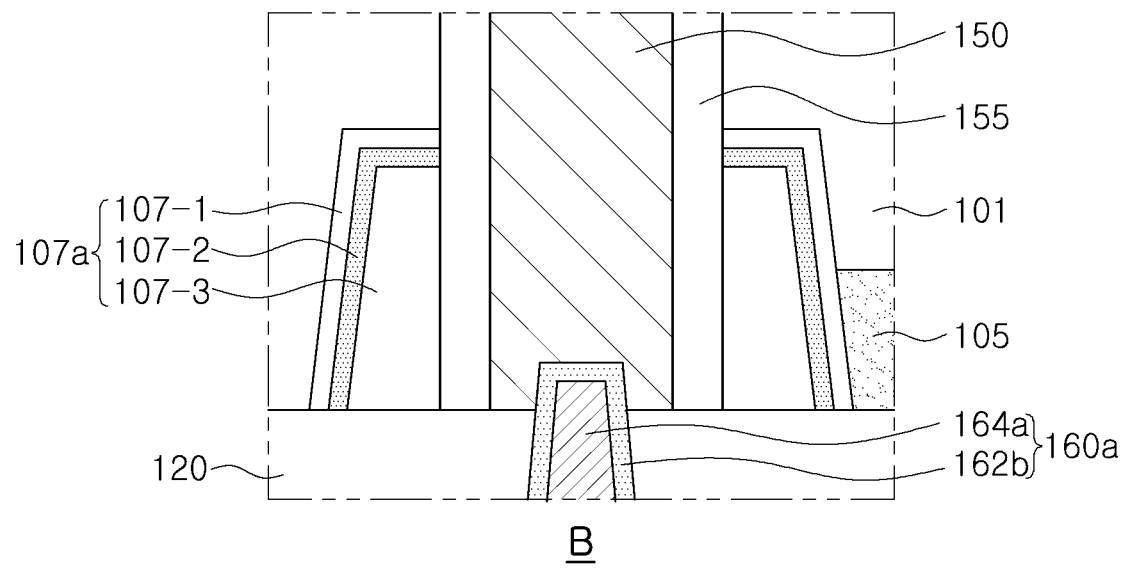
FIG. 8 is a cross-sectional view schematically illustrating a portion of an image sensor according to an exemplary embodiment of the present inventive concept.

FIG. 8 is a cross-sectional view schematically illustrating a portion of an image sensor according to an exemplary embodiment of the present inventive concept. In FIG. 8, an area corresponding to area B illustrated in FIG. 5A is illustrated as enlarged.

Referring to FIG. 8, although a first contact plug 160a extends into the contact via 150, an upper end of the first contact plug 160a may be disposed within a boundary of a device isolation region 107a, unlike the first contact plug 160 according to the exemplary embodiment described with reference to FIG. 5A. In this case, the buried insulating layer 157 of FIG. 5A may be omitted. The device isolation region 107a may have a multilayer structure including a buffer oxide layer 107-1, a liner layer 107-2, and a device isolation insulating layer 107-3, sequentially arranged on a side surface of a trench. The multilayer structure of the device isolation region 107a may be applied to other exemplary embodiments of the present inventive concept.

Figure 9:
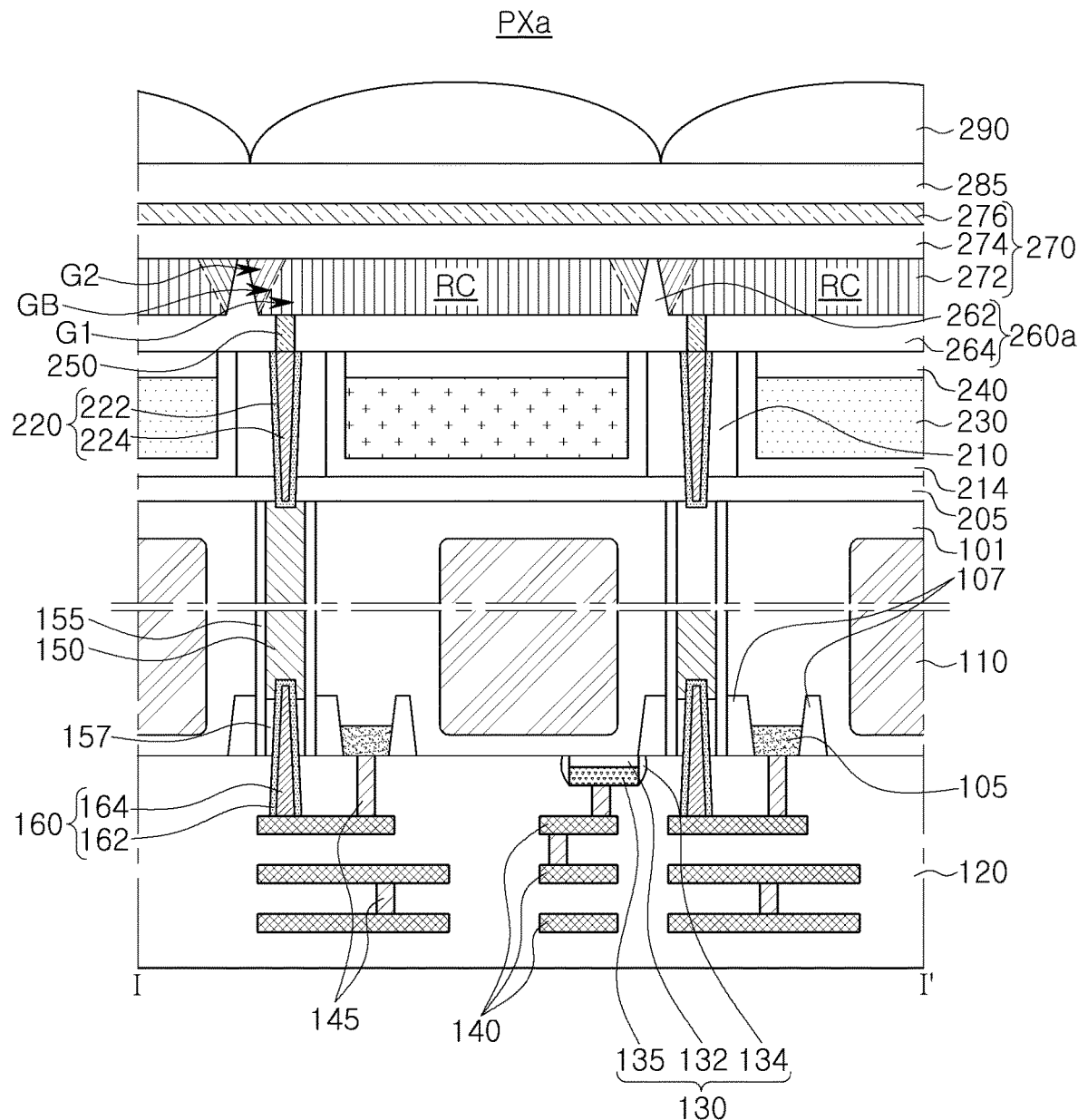
FIGS. 9 to 11 are schematic cross-sectional views illustrating pixel areas of image sensors according to exemplary embodiments of the present inventive concept.
Figure 10:
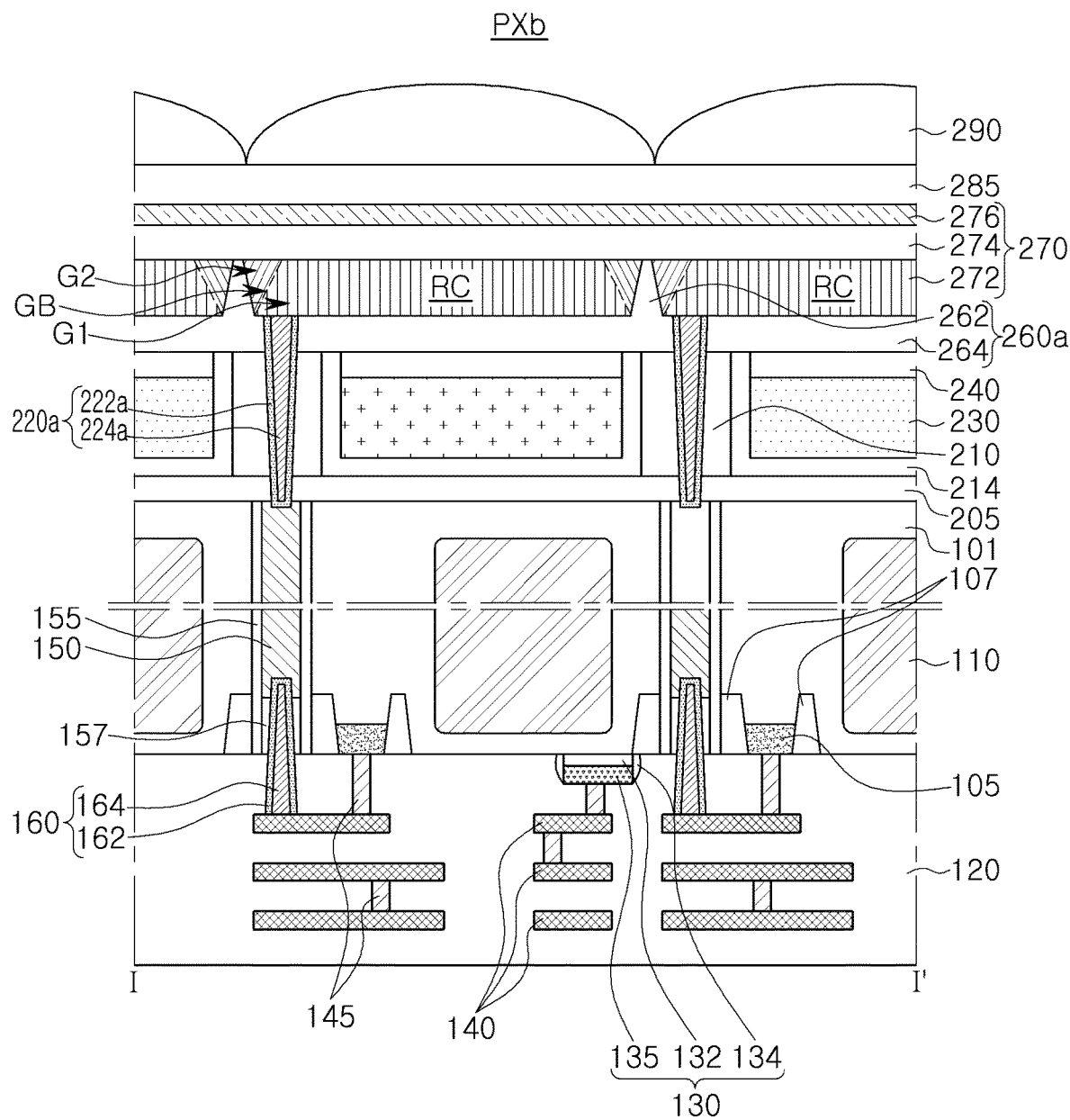
Figure 11:
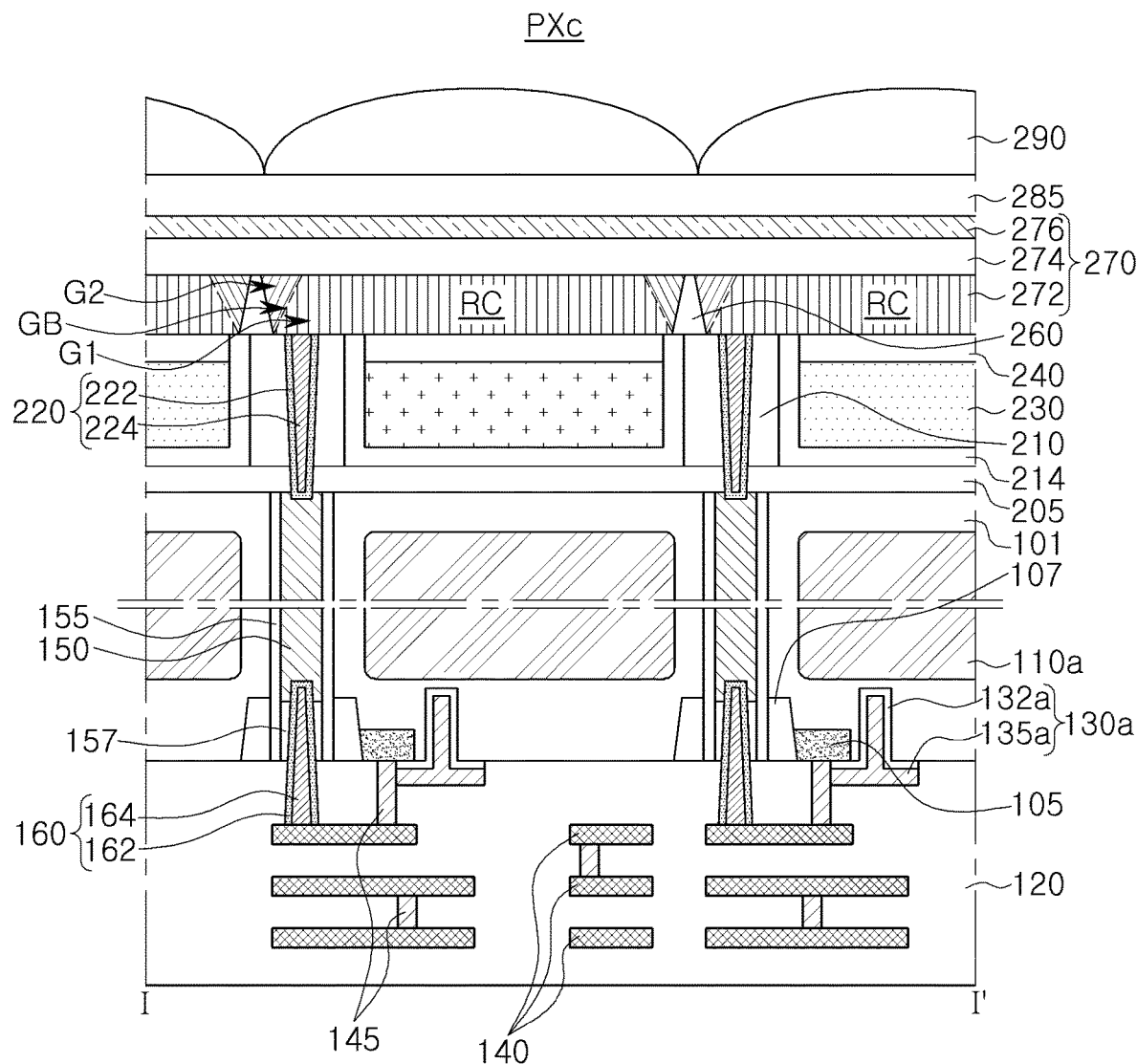

FIGS. 9 to 11 are schematic cross-sectional views illustrating pixel areas of image sensors according to exemplary embodiments of the present inventive concept.

Referring to FIG. 9, a pixel area PXa may include an electrode insulating layer 260a. Unlike the electrode insulating layer 260 disposed in the pixel area PX of FIG. 5A, the electrode insulating layer 260a may include an isolator 262 protruding into one of the first electrodes 272 from a base 264 disposed below the isolator 262. The base 264 and the isolator 262 may define the recess regions RC. In addition, the pixel area PXa may further include electrode contacts 250.

The electrode insulating layer 260a may have a structure in which the base 264 is added to the electrode insulating layer 260 of FIG. 5A. In some example embodiments, the electrode insulating layer 260a may have a structure integrated with at least a portion of underlying insulating layers such as the capping insulating layers 240.

The electrode contacts 250 may pass through the base 264 of the electrode insulating layer 260a to connect the first electrodes 272 and the second contact plugs 220. The electrode contacts 250 may be formed of a conductive material. For example, the electrode contacts 250 may be formed of the same material as the first electrode 272, but the present inventive concept is not limited thereto. Relative sizes of the electrode contacts 250 and the second contact plugs 220 are not limited those illustrated in the drawings, and may be modified in various example embodiments of the present inventive concept.

Referring to FIG. 10, an electrode insulating layer 260a disposed in a pixel area PXb may include an isolator 262 protruding into one of the first electrodes 272 from a base 264 disposed below the isolator 262. The base 264 and the isolator 262 may define the recess regions RC, similar to FIG. 9. However, the pixel area PXb may have a structure in which second contact plugs 220a are disposed to pass through the base 264, unlike FIG. 9.

The second contact plugs 220a may include a second barrier layer 222a and a second conductive layer 224a. The second contact plugs 220a may be directly connected to the first electrode 272, and may be connected to the contact vias 150 through the base 264, the upper insulating layer 210, and the antireflective layer 205 without using the electrode contacts 250 of FIG. 9.

Referring to FIG. 11, a pixel area PXc may include a transfer circuit device 130a as a part of the pixel circuit devices 130, unlike FIGS. 5A to 10. The transfer circuit device 130a may correspond to the transfer transistor TX described above with reference to FIG. 3B.

The transfer circuit device 130a may extend into the substrate 101 from a lower surface of the substrate 101 to an upper surface of the substrate 101. The transfer circuit device 130a may include a transfer circuit insulating layer 132a and a transfer circuit electrode layer 135a. The transfer circuit insulating layer 132a may be disposed between the transfer circuit electrode layer 135a and the substrate 101, and cover side and upper surfaces of the transfer circuit electrode layer 135a. The transfer circuit electrode layer 135a may be electrically connected to a storage node region 105 on the lower surface of the substrate 101. Since the transfer circuit electrode layer 135a is disposed to be perpendicular to the lower surface of the substrate 101, a photodiode 110a may be disposed relatively widely over the transfer circuit electrode layer 135a. Unlike the photodiode 110 of FIG. 5A, the photodiode 110a may be disposed relatively widely from side to side in the pixel area PXc, but the present inventive concept is not limited thereto.

FIGS. 12A to 12I are cross-sectional views schematically illustrating a method of fabricating an image sensor according to an exemplary embodiment of the present inventive concept. In FIGS. 12A to 12I, a method of fabricating an image sensor including the pixel area PX illustrated in FIGS. 3 to 5B is exemplarily illustrated.

Figure 12A:
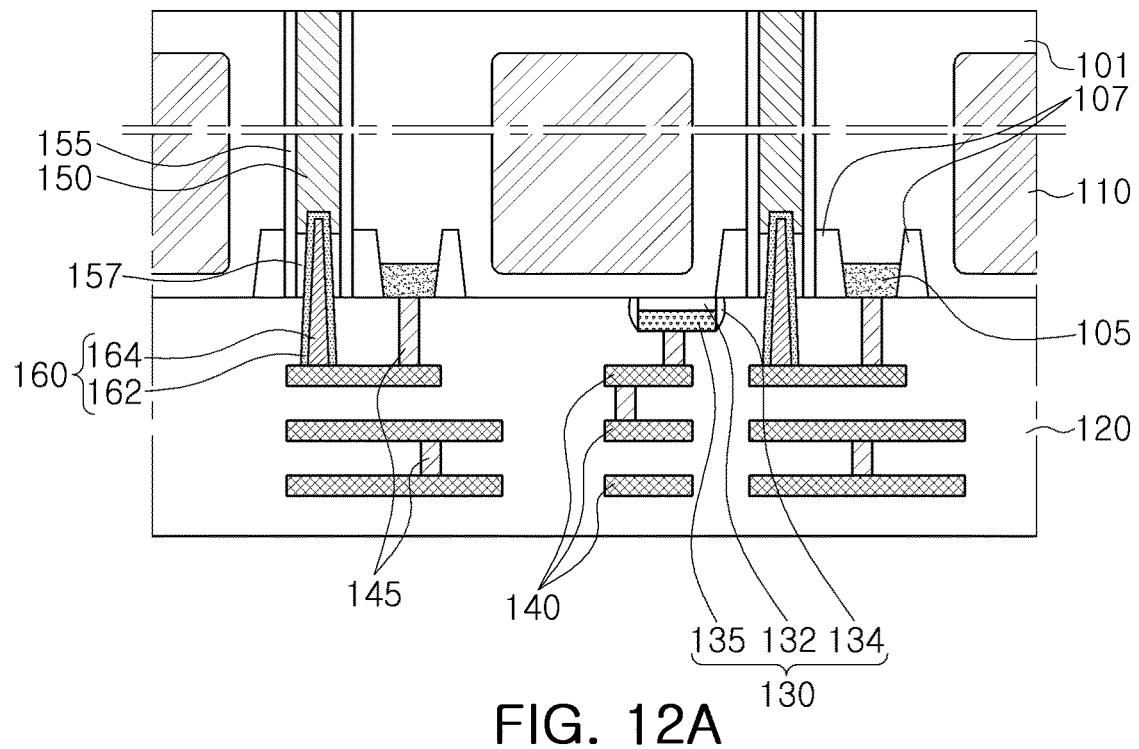
FIGS. 12A to 12I are cross-sectional views schematically illustrating a method of fabricating an image sensor according to an exemplary embodiment of the present inventive concept.

Referring to FIG. 12A, storage node regions 105, device isolation regions 107, photodiodes 110, and contact vias 150 may be formed in a substrate 101. An interlayer insulating layer 120, pixel circuit devices 130, interconnection layers 140, interconnection vias 145, and first contact plugs 160 may be formed on a lower surface of the substrate 101.

The device isolation regions 107 may be formed by forming trenches extending from the lower surface of the substrate 101 and filling the trenches with an insulating material. The storage node regions 105 and the photodiodes 110 may be formed by injecting impurities from the lower surface of the substrate 101 in an ion implantation process. For example, the storage node regions 105 and the photodiodes 110 may be formed by injecting n-type impurities. The contact vias 150 may be formed by forming holes that extend to partially pass through the device isolation regions 107 and pass through the substrate 101, and filling the holes with a conductive material. Before filling the holes with the conductive material, via insulating layers 155 may be formed by depositing insulating materials on inner side surfaces of the holes. The conductive material may be partially removed from the holes by an etchback process, and then a buried insulating layer 157 may fill the spaces where the conductive material is partially removed. The pixel isolation regions 170 illustrated in FIG. 5B may also be formed together with the contact vias 150 in this process.

Next, pixel circuit devices 130, interconnection layers 140, and interconnection vias 145 may be formed on the lower surface of the substrate 101. After forming the pixel circuit devices 130, at least a portion of the interlayer insulating layer 120 may be formed on the lower surface of the substrate 101. The first contact plugs 160 may pass through a portion of the interlayer insulating layer 120 and the buried insulating layer 157 to be connected to the contact vias 150. The first contact plugs 160 may be formed by forming a first barrier layer 162 and then forming a first conductive layer 164. The interlayer insulating layer 120 may be formed in several portions in the process of forming the interconnection layers 140 and the interconnection vias 145, resultantly to cover the components disposed on the lower surface of the substrate 101. In some example embodiments, a support layer supporting the substrate 101 during the process may be further formed on a lower surface of the interlayer insulating layer 120.

Next, a polishing process or a back-grinding process, in which a thickness of the substrate 101 is reduced, may be performed on an upper surface of the substrate 101 to expose an end of the contact vias 150.

Figure 12B:
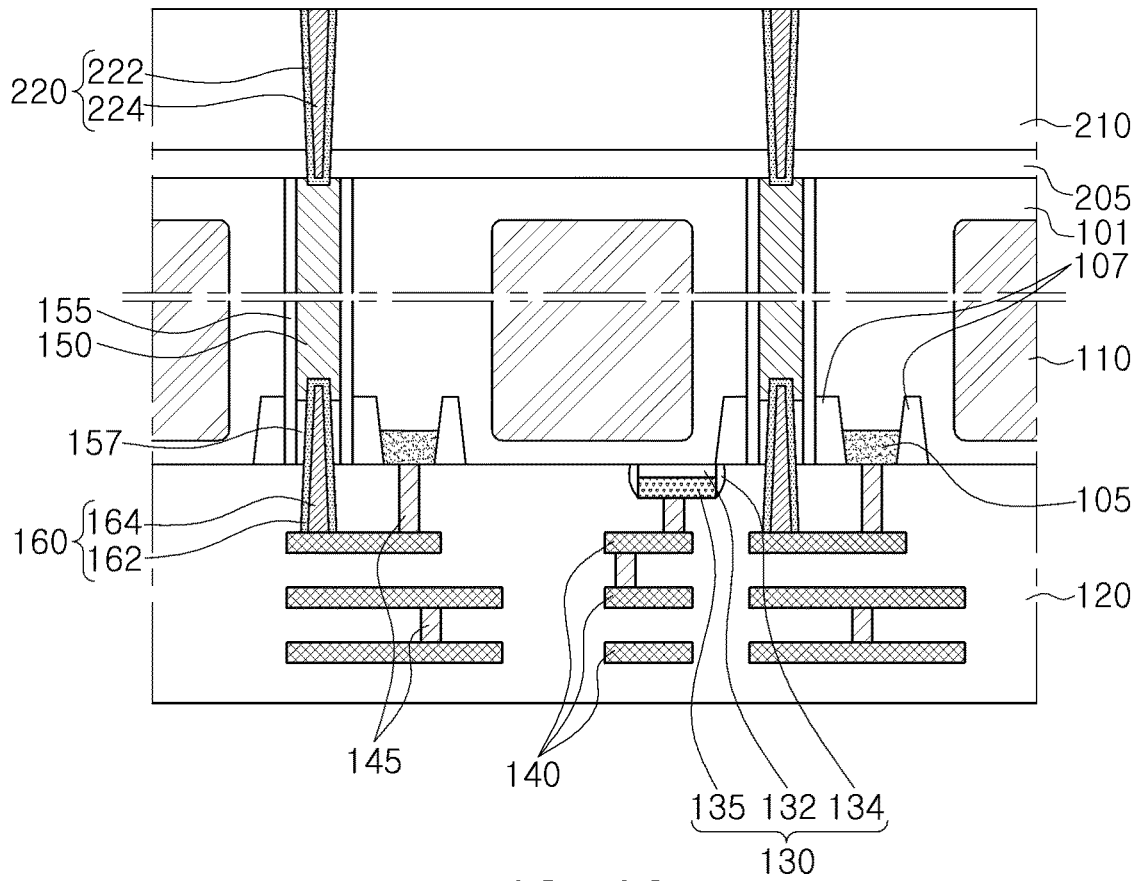

Referring to FIG. 12B, an antireflective layer 205, an upper insulating layer 210, and second contact plugs 220 may be formed on the upper surface of the substrate 101.

First, the antireflective layer 205 and the upper insulating layer 210 may be sequentially formed. Then holes passing through the antireflective layer 205 and the upper insulating layer 210 and exposing the contact vias 150 may be formed. The second contact plugs 220 may be formed by sequentially forming a second barrier layer 222 and a second conductive layer 224 in the holes. The second barrier layer 222 may be formed to cover side and lower surfaces of the second conductive layer 224.

Figure 12C:
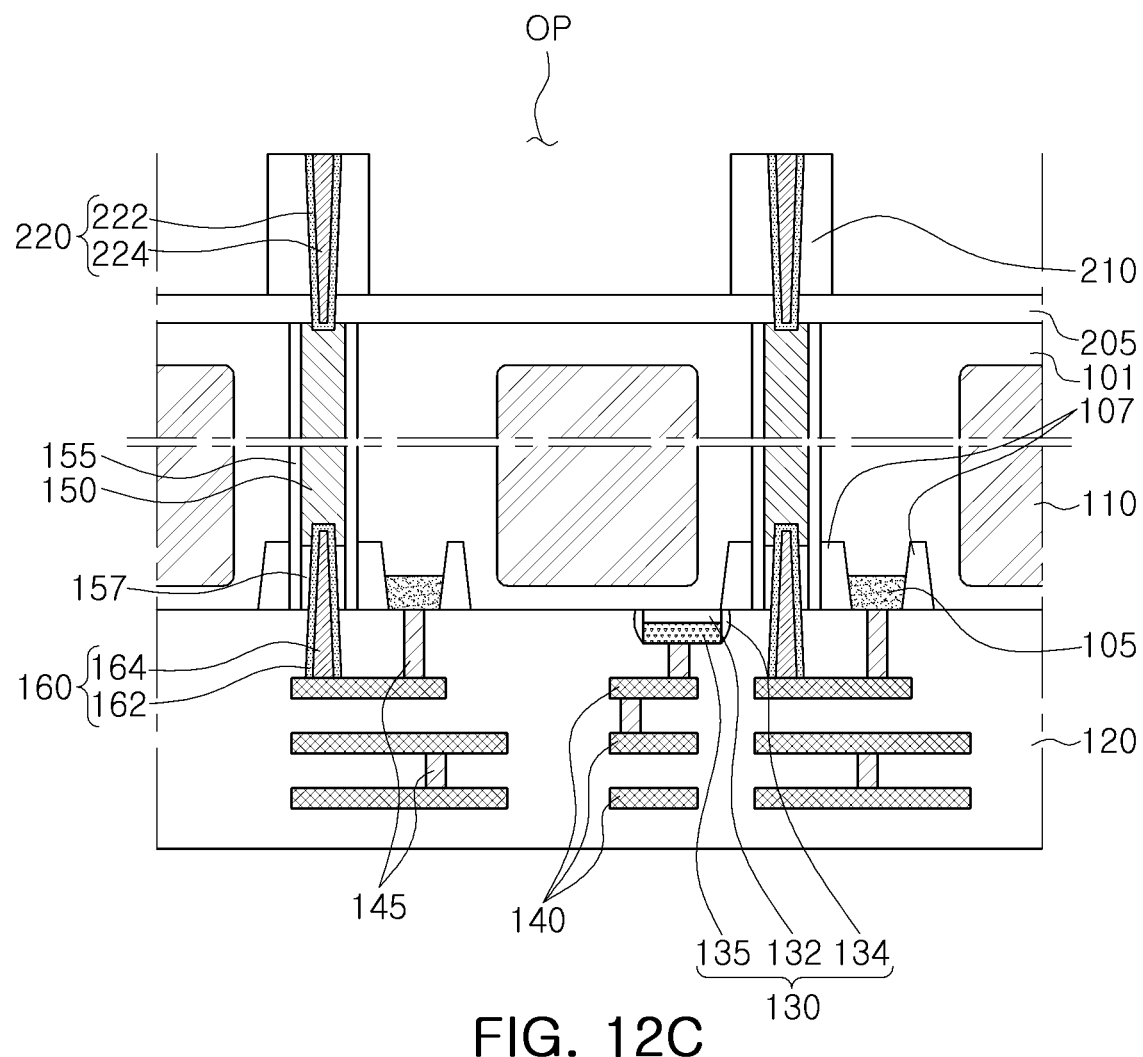

Referring to FIG. 12C, openings OP may be formed by partially removing the upper insulating layer 210.

The openings OP may be formed to correspond to areas in which color filters 230 are arranged in a subsequent process. The openings OP may be formed to overlap areas in which photodiodes 110 are formed in a plan view. The openings OP may be formed to expose the antireflective layer 205.

Figure 12D:
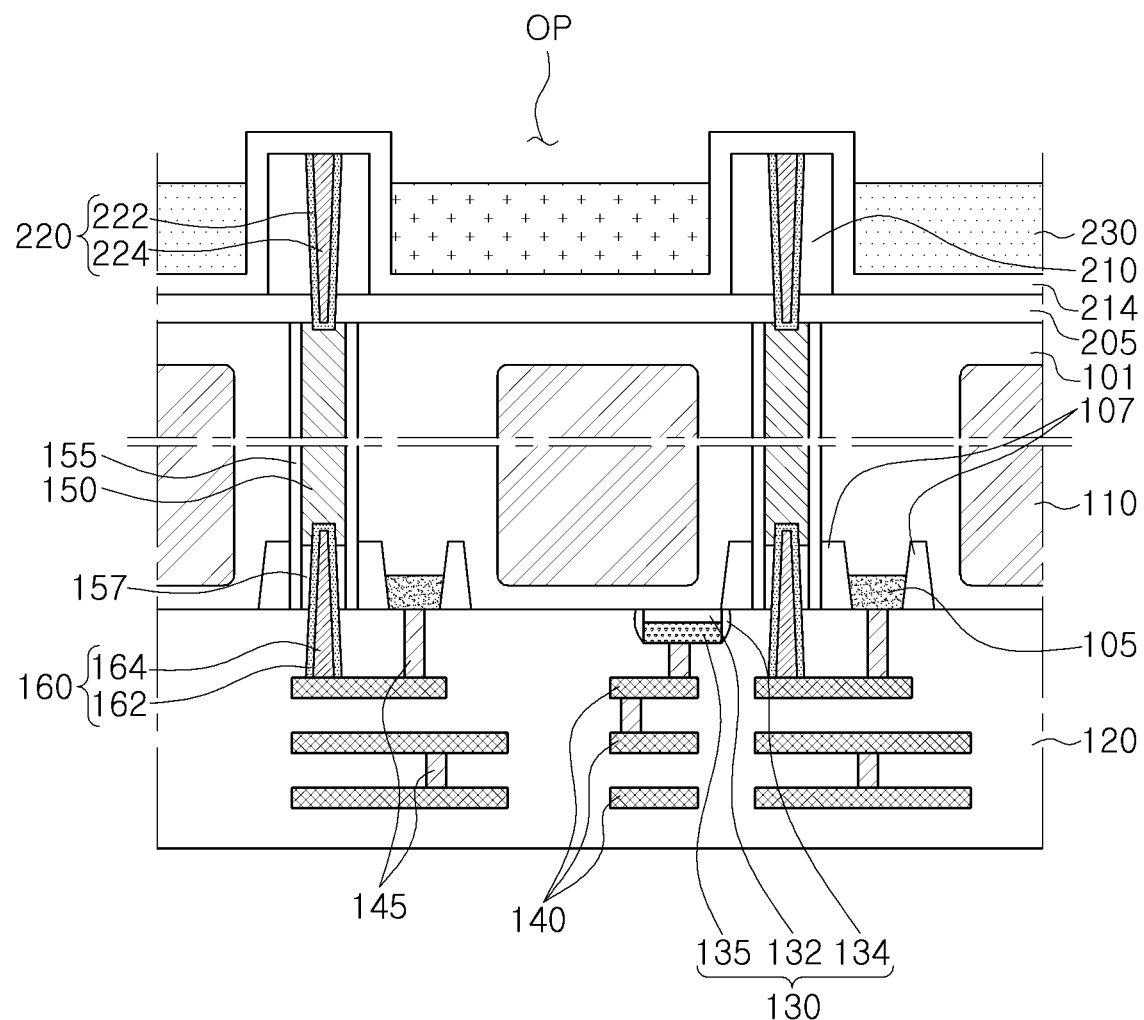

Referring to FIG. 12D, a filter insulating layer 214 may be conformally formed in the openings OP, and color filters 230 may be formed in the openings OP with the filter insulating layer 214.

The filter insulating layer 214 may be formed as a liner layer conformally covering the upper insulating layer 210 and the antireflective layer 205. The filter insulating layer 214 may be formed of, for example, silicon oxide. In the openings OP, the color filters 230 partially filling the openings OP may be formed on the filter insulating layer 214.

Figure 12E:
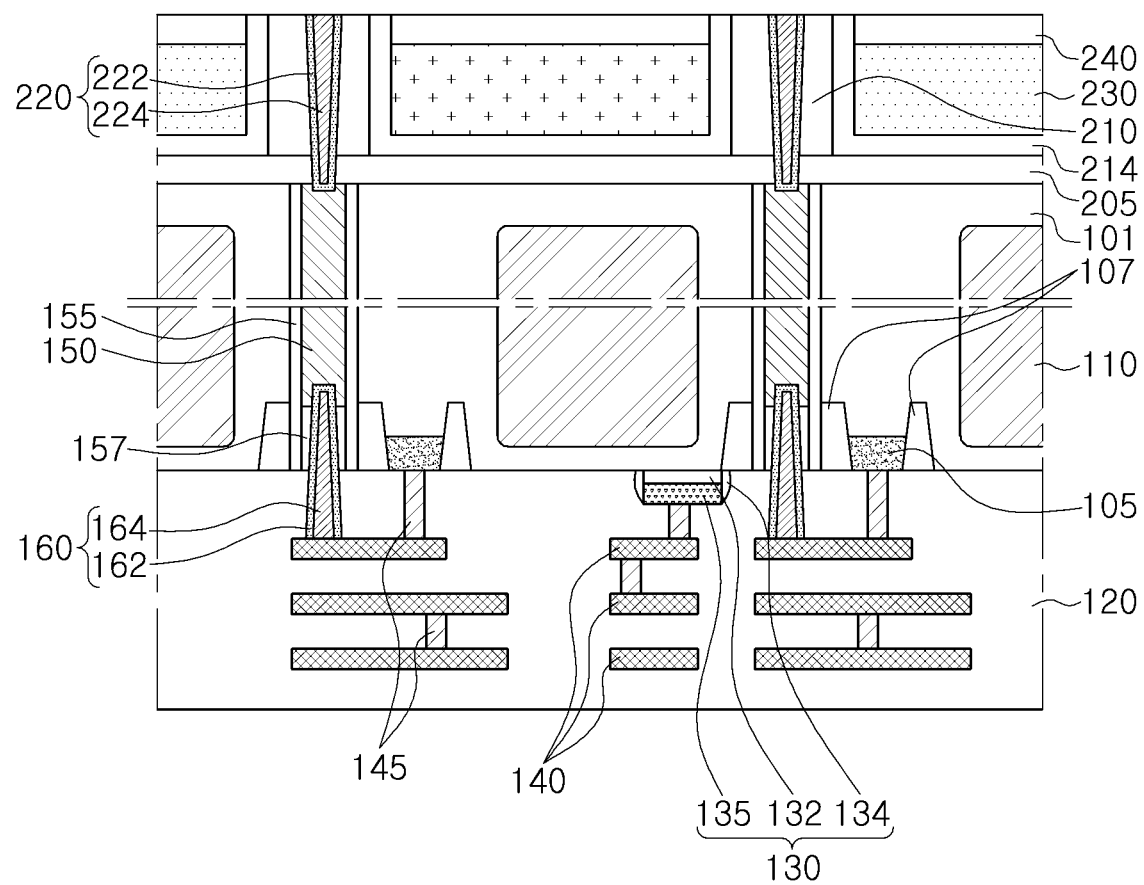

Referring to FIG. 12E, capping insulating layers 240 may be formed on the color filters 230, and a planarization process may be performed.

The capping insulating layers 240 may be formed to fill the openings OP illustrated in FIG. 12D. Next, the planarization process may be performed to expose upper ends of the second contact plugs 220. By the planarization process, the filter insulating layer 214 may be separated between the openings OP.

Figure 12F:
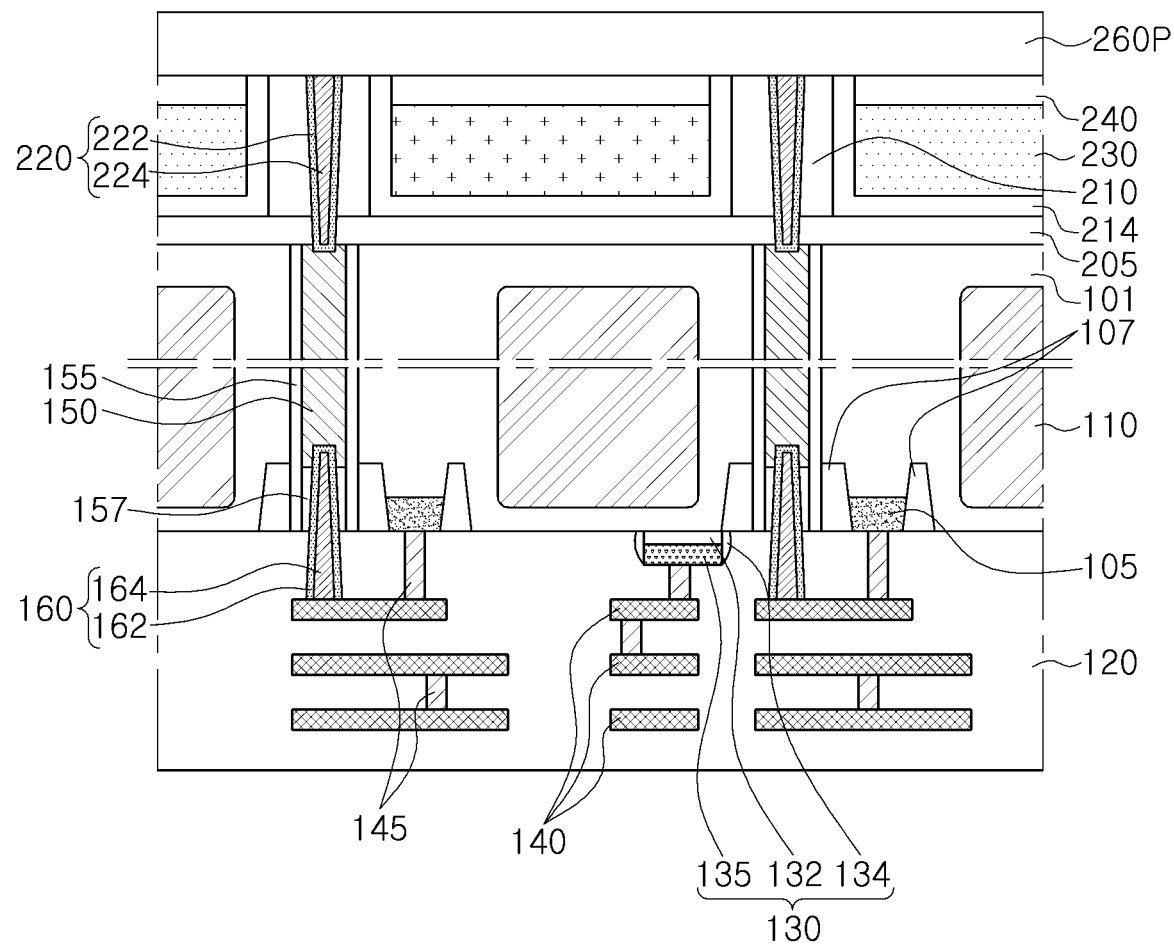

Referring to FIG. 12F, a preliminary electrode insulating layer 260P may be formed on the capping insulating layers 240, the upper insulating layer 210, the filter insulating layer 214, and the second contact plugs 220.

The preliminary electrode insulating layer 260P may be formed by a chemical vapor deposition (CVD) process or an atomic layer deposition (ALD) process, for example. The preliminary electrode insulating layer 260P may include silicon nitride or silicon oxide.

Figure 12G:
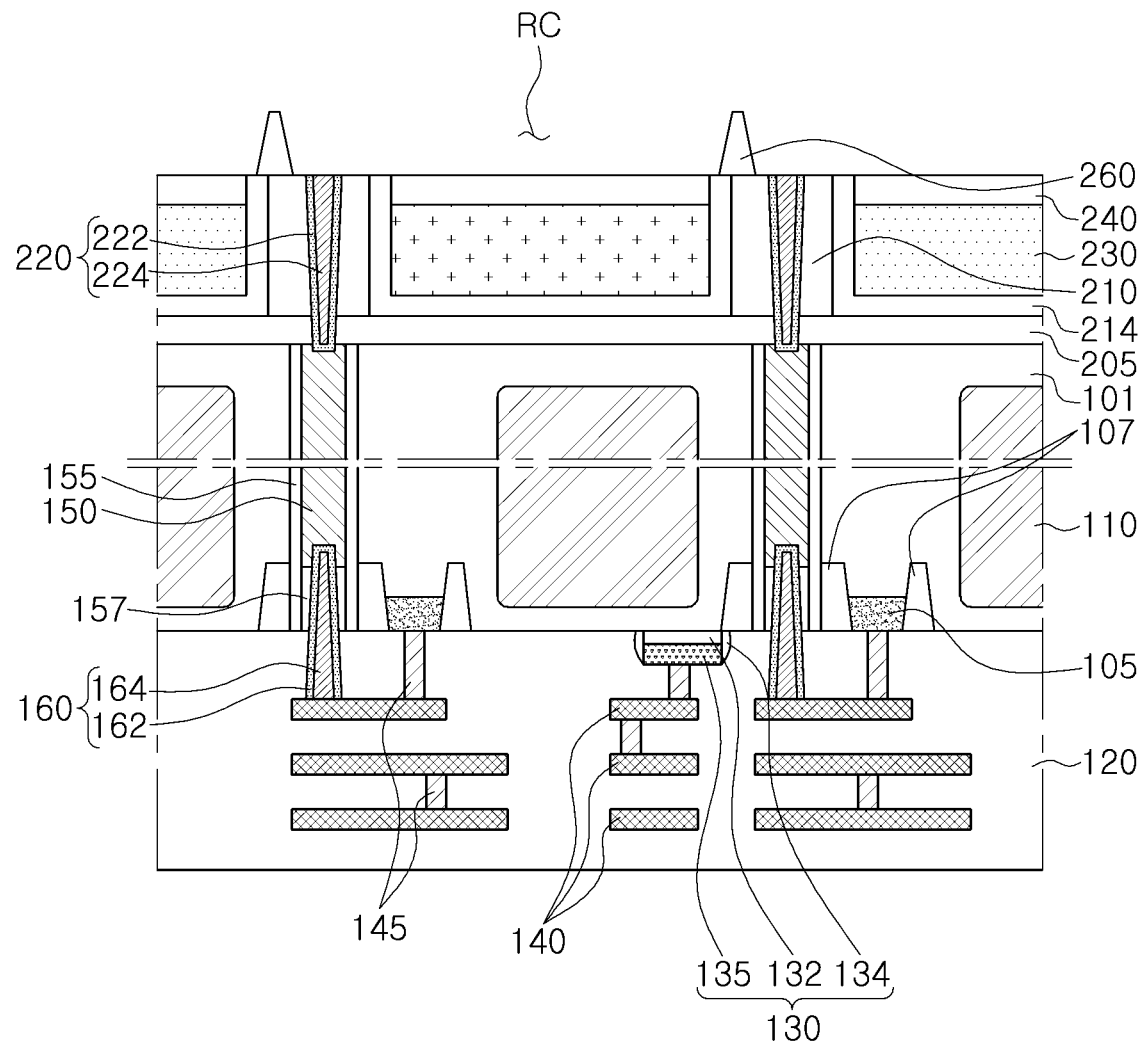

Referring to FIG. 12G, an electrode insulating layer 260 having recess regions RC may be formed by patterning the preliminary electrode insulating layer 260P.

The recess regions RC may be formed to expose the second contact plugs 220 and the capping insulating layers 240. The electrode insulating layer 260 may be formed on the upper insulating layer 210 and the filter insulating layer 214, but the present inventive concept is not limited thereto. For example, in some example embodiments, the electrode insulating layer 260 may be disposed to extend onto the capping insulating layers 240.

Figure 12H:
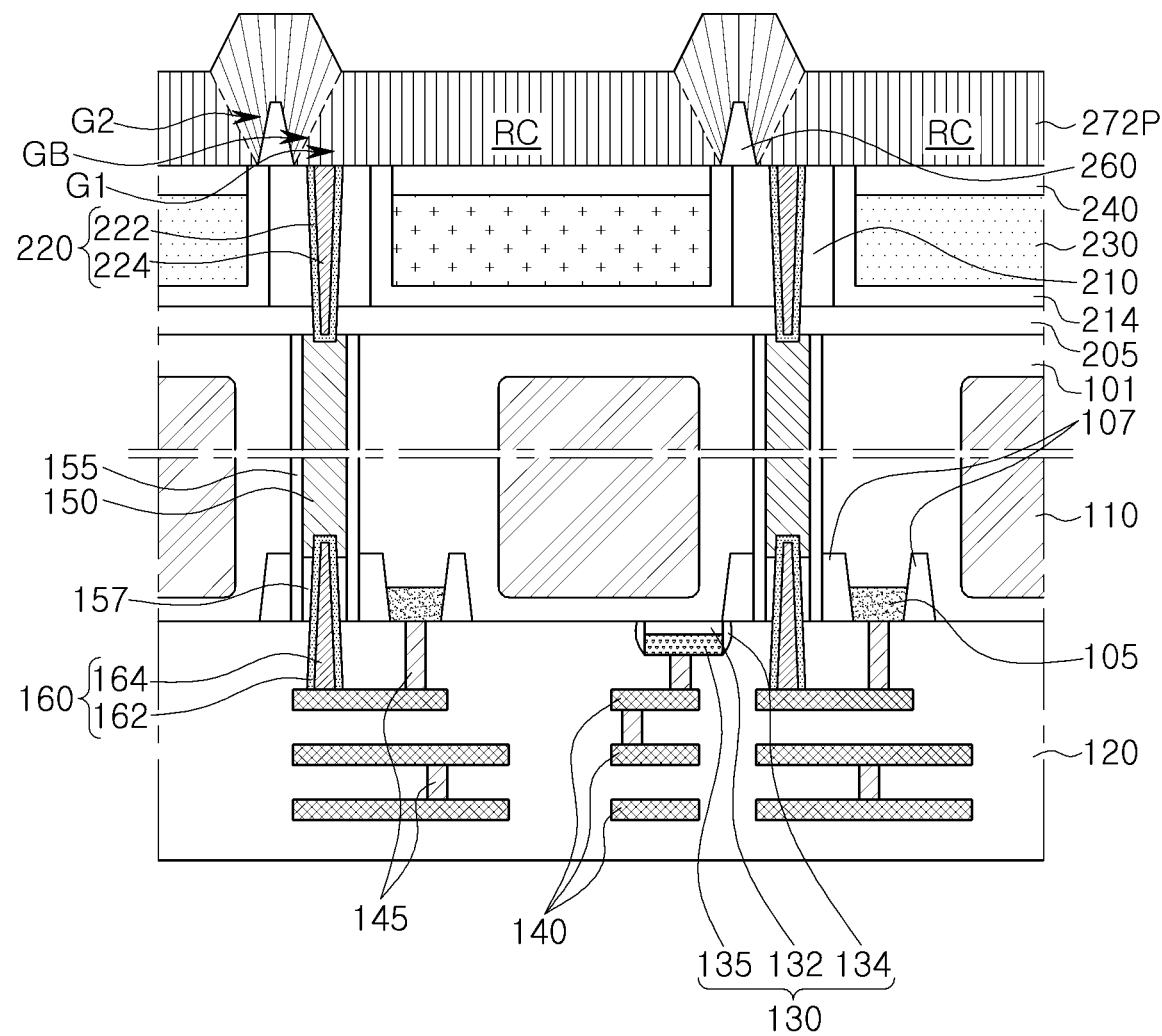

Referring to FIG. 12H, a first preliminary electrode 272P may be formed in the recess regions RC of the electrode insulating layer 260.

The first preliminary electrode 272P may be formed using a CVD process or a sputtering process, for example. The first preliminary electrode 272P may be grown in different directions on a lower surface and side surfaces of the recess regions RC as illustrated in FIG. 12H. Accordingly, a seam GB may be formed between a first region G1 grown from the lower surface of the recess regions RC and one of second regions G2 grown from the side surfaces of the recess regions RC. Each of the first region G1 and the second regions G2 may include a poly-crystalline phase, an amorphous phase or a combination thereof. Specifically, the seam GB may be a grain boundary region where crystalline crystal grains may collide with each other. For example, the second regions G2 may be grown from the side surfaces of the recess regions RC and the first region G1 may be grown from the lower surface of the recess regions RC. In this case, the first region G1 may collide or meet with the second regions G2 so that the seam GB is formed in the forming of the first preliminary electrode 272P. The region, shown by the broken line, where the collision between the first region G1 and one of the second region G2 occurs becomes the seam GB which has a lower density and a weaker chemical bond than grain boundaries within each of the first region G1 and the second regions G2. The seam GB may be formed from three surfaces including the lower surface of one of the recess regions RC and the two side surfaces extended from the lower surface of the one of the recess regions RC. In an exemplary embodiment, the seam GB may be a void that can be seen through a naked eye, unlike the grain boundaries within each of the first region G1 and the second regions G2.

Figure 12I:
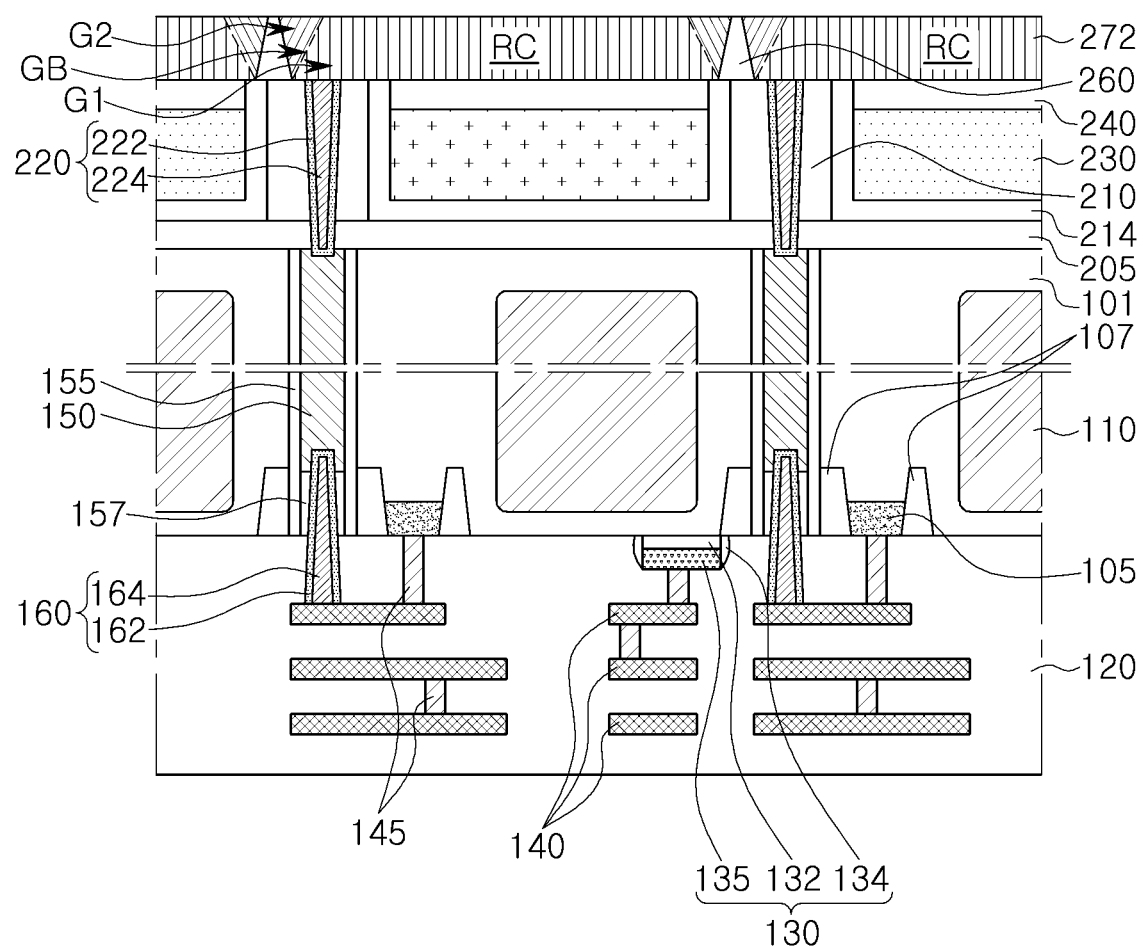

Referring to FIG. 12I, first electrodes 272 may be formed by performing a planarization process on the first preliminary electrode 272P.

The planarization process may be a chemical mechanical polishing (CMP) process. In the planarization process, the electrode insulating layer 260 may be exposed.

Next, referring to FIGS. 5A and 5B, organic photodiodes 270 may be formed by sequentially forming a photoelectric conversion layer 274 and a second electrode 276 on the first electrodes 272. Next, an image sensor including the pixel area PX illustrated in FIGS. 3 to 5B may be formed by forming a cover insulating layer 285 and microlenses 290 on the organic photodiodes 270.

In an exemplary embodiment, the first electrodes 272 each may include the first region G1, the second regions G2, and the seam GB dividing the first region G1 and one of the second regions G2. The first region G1 may a decreasing width toward the photoelectric conversion layer 274, and one of the second regions G2 may have an increasing width toward the photoelectric conversion layer 274.

Figure 13A:
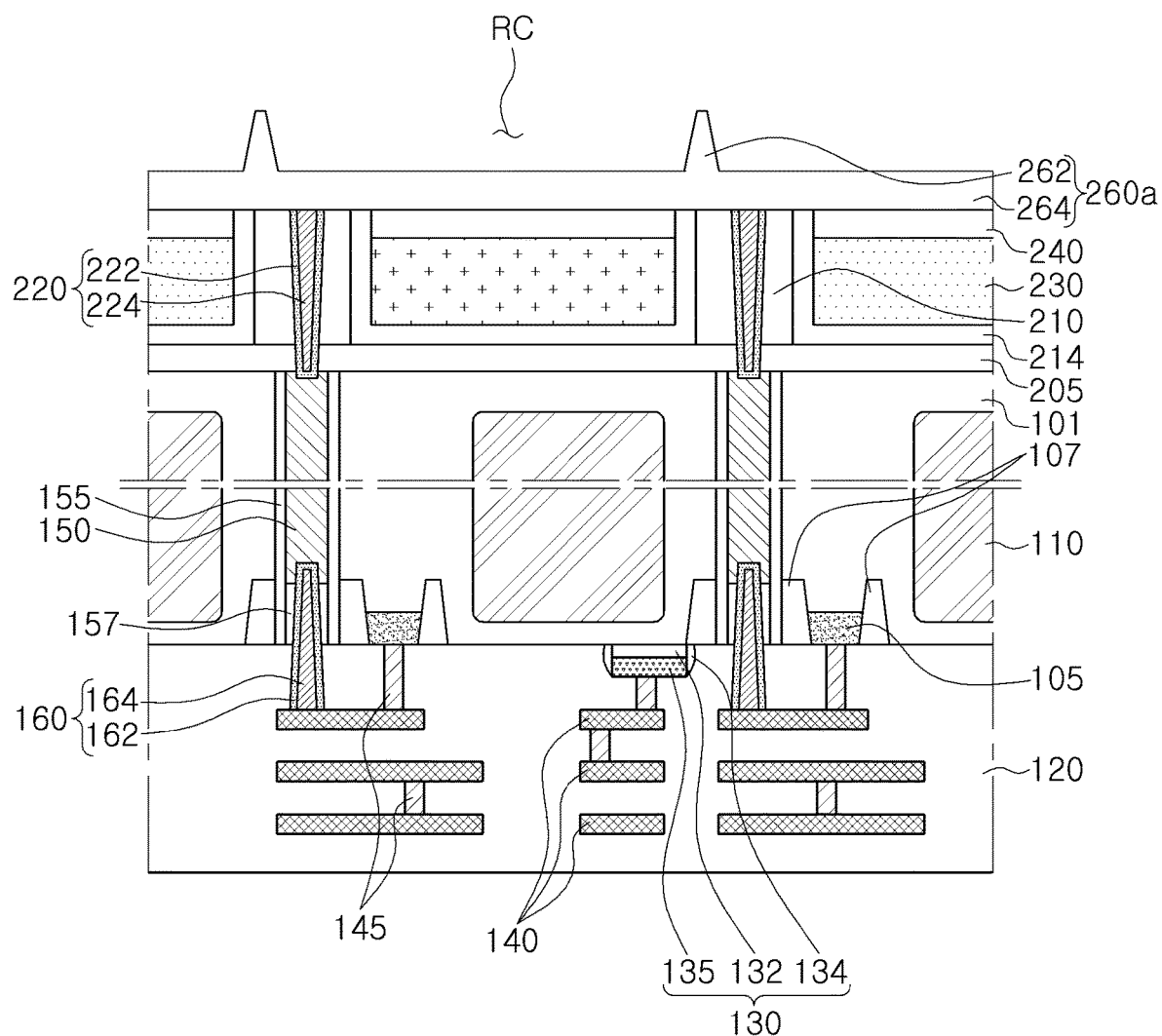
FIGS. 13A to 13C are cross-sectional views schematically illustrating a method of fabricating an image sensor according to an exemplary embodiment of the present inventive concept.
Figure 13B:
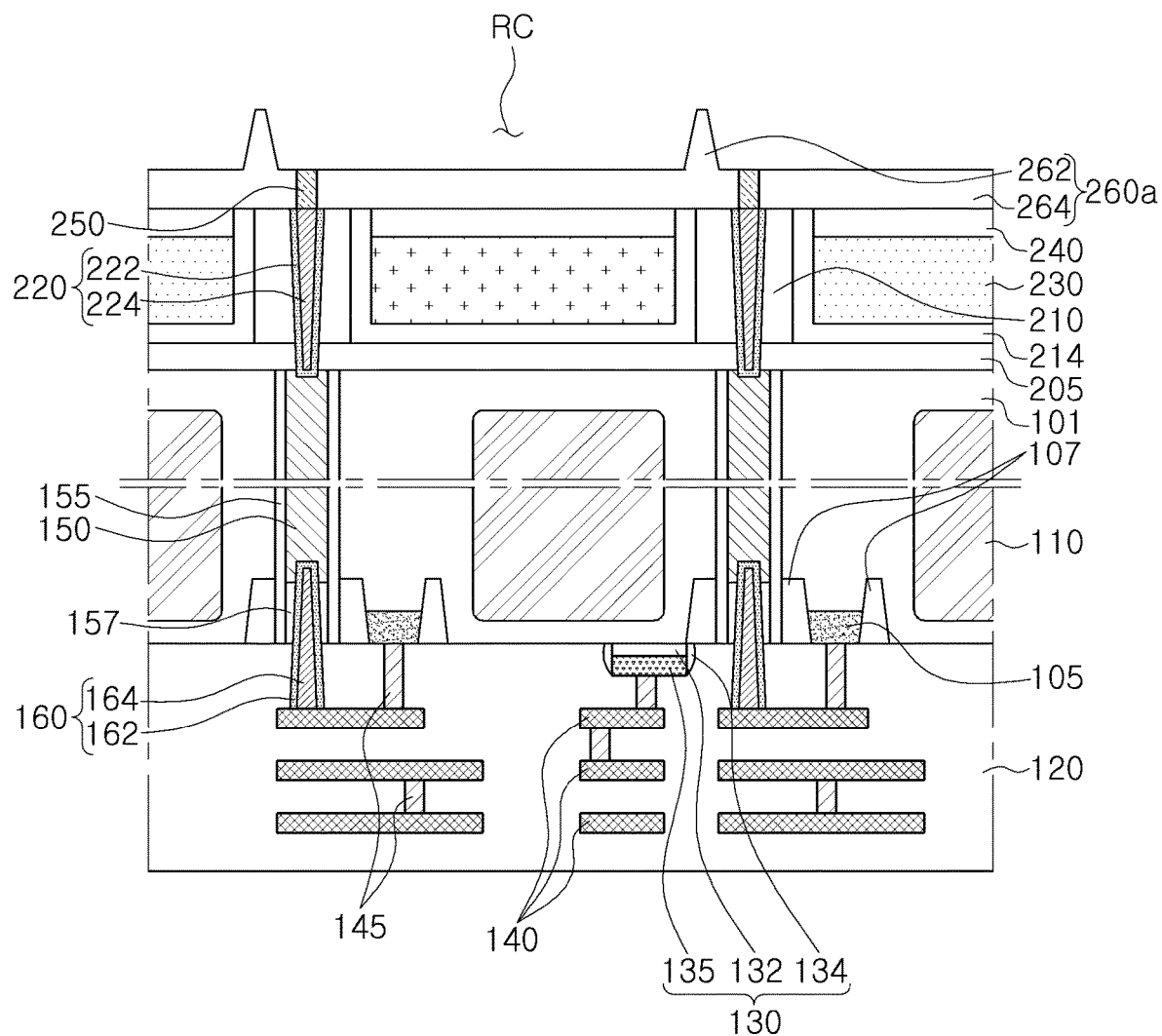
Figure 13C:
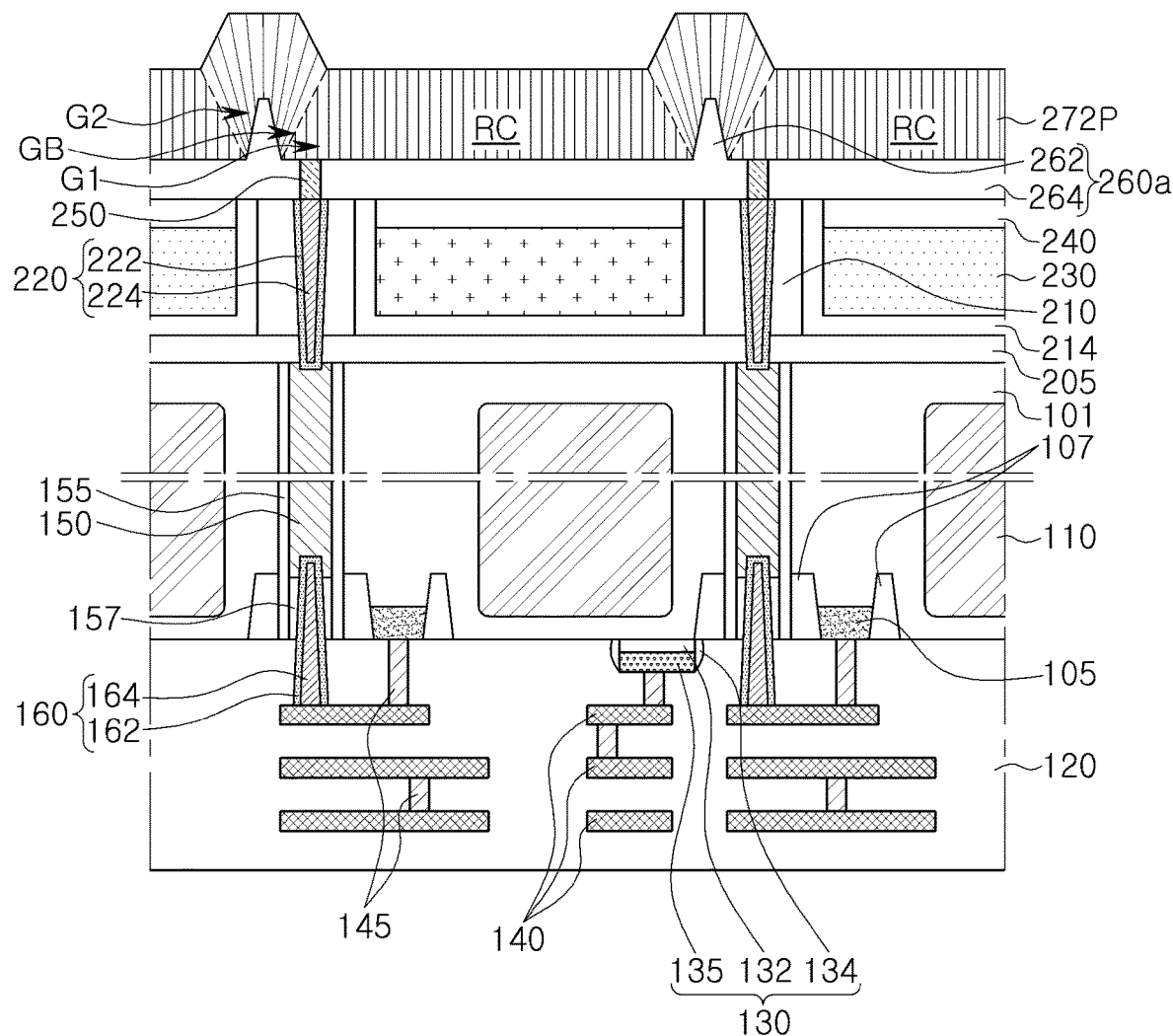

FIGS. 13A to 13C are cross-sectional views schematically illustrating a method of fabricating an image sensor according to an exemplary embodiment of the present inventive concept. In FIGS. 13A to 13C, a method of fabricating an image sensor including the pixel area PXa illustrated in FIG. 9 is exemplarily illustrated.

First, referring to FIG. 13A, the processes described above with reference to FIGS. 12A to 12F may be performed.

Next, an electrode insulating layer 260a having recess regions RC may be formed by patterning a preliminary electrode insulating layer 260P of FIG. 12F. An upper portion of the preliminary electrode insulating layer 260P may be removed by a predetermined thickness to form the electrode insulating layer 260a. The electrode insulating layer 260a may include an isolator 262 and a base 264 surrounding the recess regions RC together with the isolator 262 and disposed below the isolator 262. The electrode insulating layer 260a may be formed in a single layer covering an upper insulating layer 210, a filter insulating layer 214, second contact plugs 220, and capping insulating layers 240.

Referring to FIG. 13B, electrode contacts 250 passing through the base 264 may be formed.

The electrode contacts 250 may be formed by forming holes passing through the base 264 of the electrode insulating layer 260a and exposing the second contact plugs 220, and filling the holes with a conductive material.

Referring to FIG. 13C, a first preliminary electrode 272P may be formed in the recess regions RC of the electrode insulating layer 260a.

The first preliminary electrode 272P may be formed to include first regions G1 and second regions G2, as described above with reference to FIG. 12H. The first preliminary electrode 272P may be in contact with the electrode contacts 250 in the recess regions RC. In some example embodiments, the electrode contacts 250 may be formed together with the first preliminary electrode 272P. In this case, the electrode contacts 250 may be formed of the same material as the first preliminary electrode 272P.

Next, the image sensor including the pixel area PXa illustrated in FIG. 9 may be formed by performing subsequent processes, as described above with reference to FIG. 12I.

FIGS. 14A to 14E are cross-sectional views schematically illustrating a method of fabricating an image sensor according to an exemplary embodiment of the present inventive concept. In FIGS. 14A to 14E, a method of fabricating an image sensor including the pixel area PXb illustrated in FIG. 10 is exemplarily illustrated.

Figure 14A:
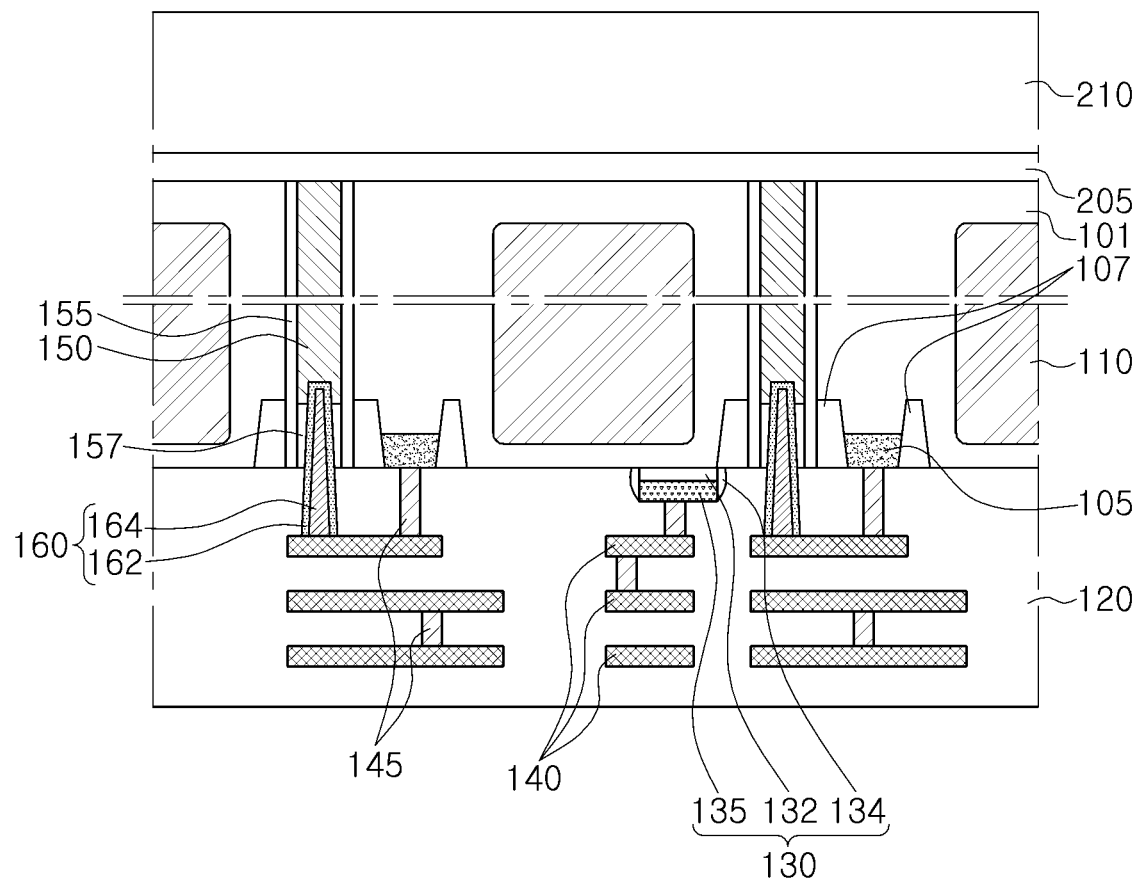
FIGS. 14A to 14E are cross-sectional views schematically illustrating a method of fabricating an image sensor according to an exemplary embodiment of the present inventive concept.

Referring to FIG. 14A, the process described above with reference to FIG. 12A may be performed. Next, an antireflective layer 205 and an upper insulating layer 210 may be formed on an upper surface of the substrate 101.

Figure 14B:
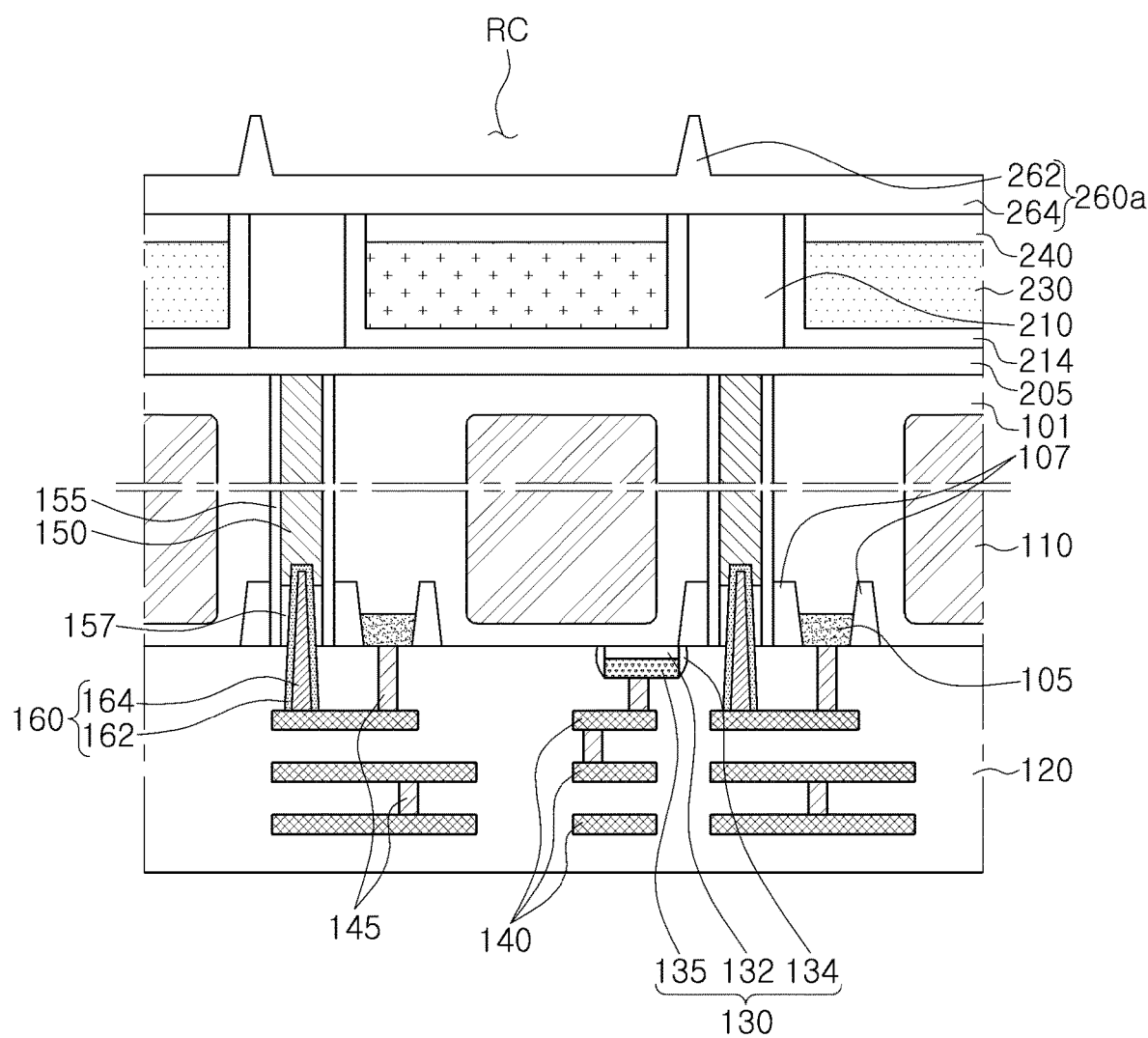

Referring to FIG. 14B, similar to the processes described above with reference to FIGS. 12C to 12F, openings OP may be formed by partially removing the upper insulating layer 210, then a filter insulating layer 214 may be conformally formed on the openings OP, and then color filters 230 may be formed. Capping insulating layers 240 may be formed on the color filters 230, and a preliminary electrode insulating layer 260P may be formed.

Next, an electrode insulating layer 260a having recess regions RC may be formed by patterning the preliminary electrode insulating layer 260P. An upper portion of the preliminary electrode insulating layer 260P may be removed by a predetermined thickness to form the electrode insulating layer 260a having an isolator 262 and a base 264. The isolator 262 and the base 264 may define the recess regions RC.

Figure 14C:
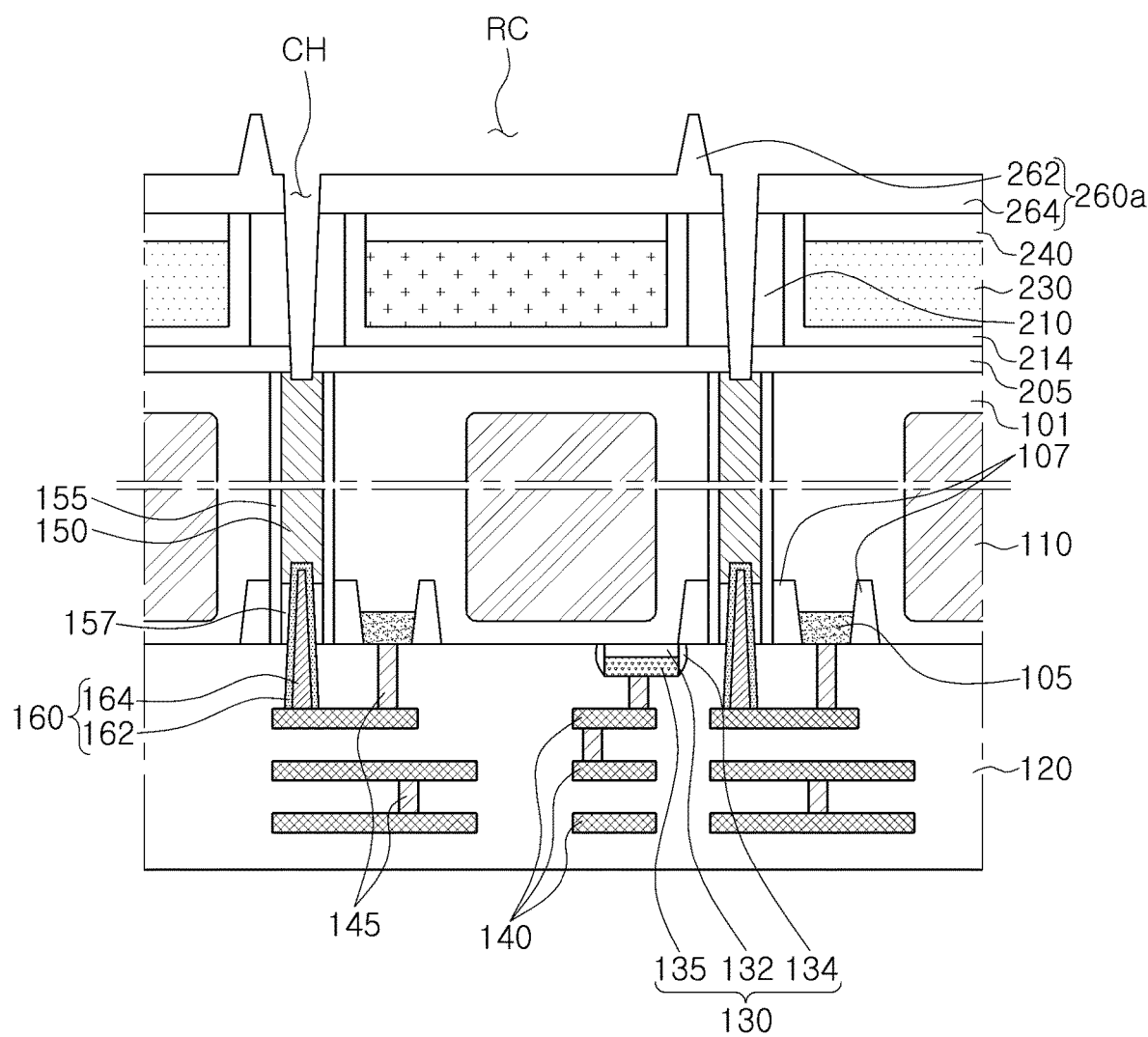

Referring to FIG. 14C, contact holes CH passing through the base 264, the upper insulating layer 210, and the antireflective layer 205 may be formed to expose the contact vias 150.

Figure 14D:
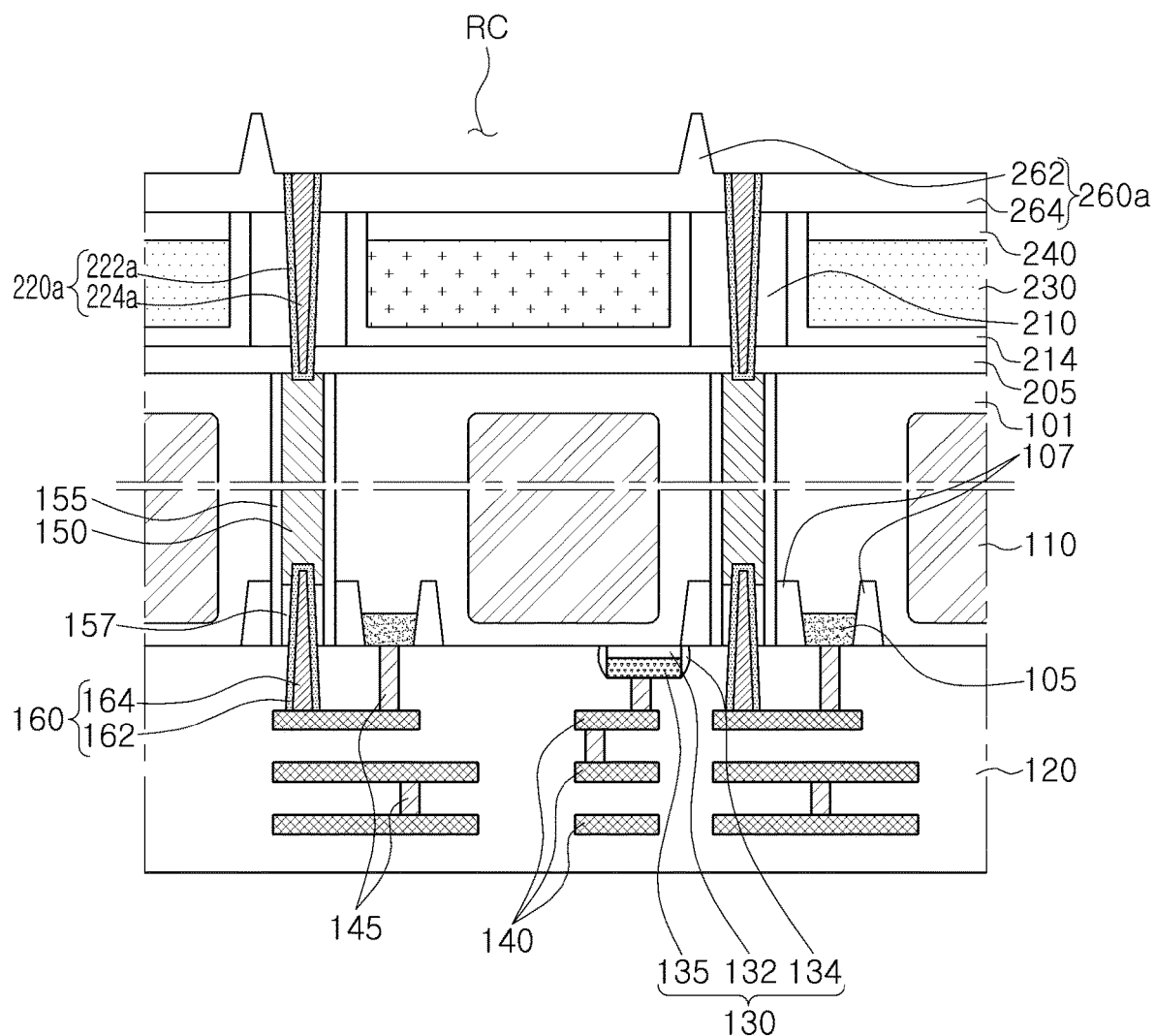

Referring to FIG. 14D, a second barrier layer 222a and a second conductive layer 224a may be sequentially formed by filling the contact holes CH. The second barrier layer 222a and the second conductive layer 224a may constitute second contact plugs 220a.

Figure 14E:
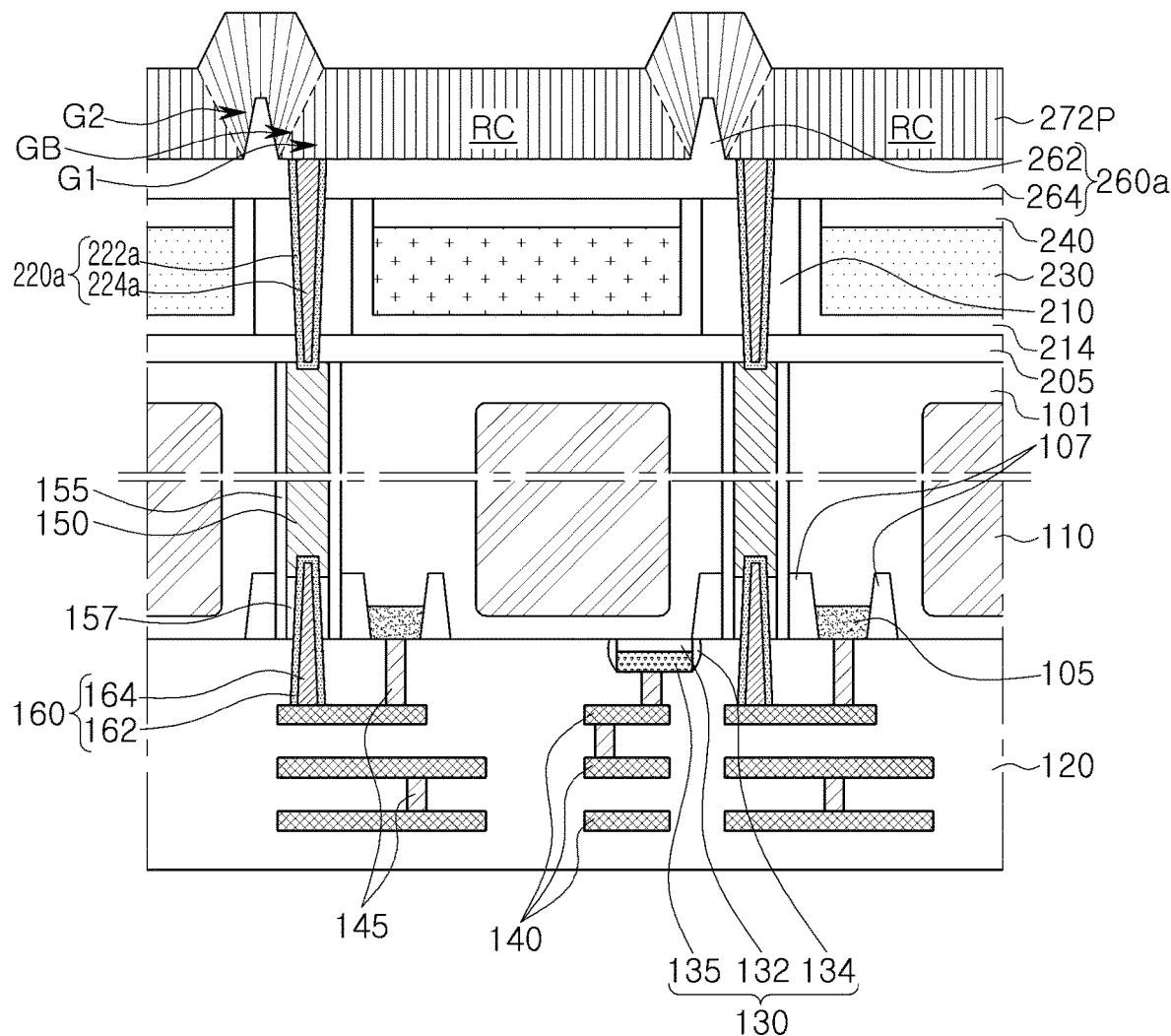

Referring to FIG. 14E, a first preliminary electrode 272P may be formed in the recess regions RC of the electrode insulating layer 260a.

The first preliminary electrode 272P may include a first region G1 and second regions G2, as described above with reference to FIG. 12H. The first preliminary electrode 272P may be in contact with the second contact plugs 220a in the recess regions RC.

Next, the image sensor including the pixel area PXb illustrated in FIG. 10 may be formed by performing subsequent processes, as described above with reference to FIG. 12I.

Figure 15A:
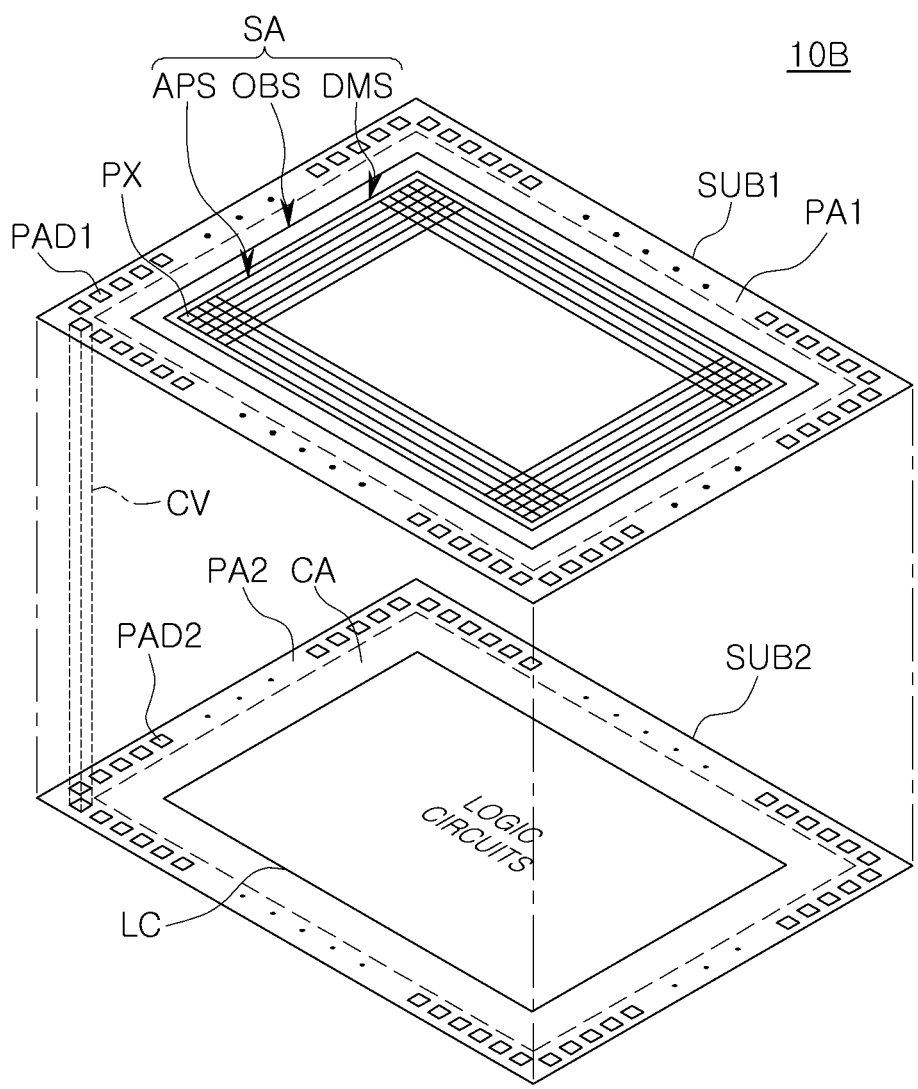
FIGS. 15A to 15C are diagrams illustrating schematic layouts of image sensors according to an exemplary embodiment of the present inventive concept.
Figure 15B:
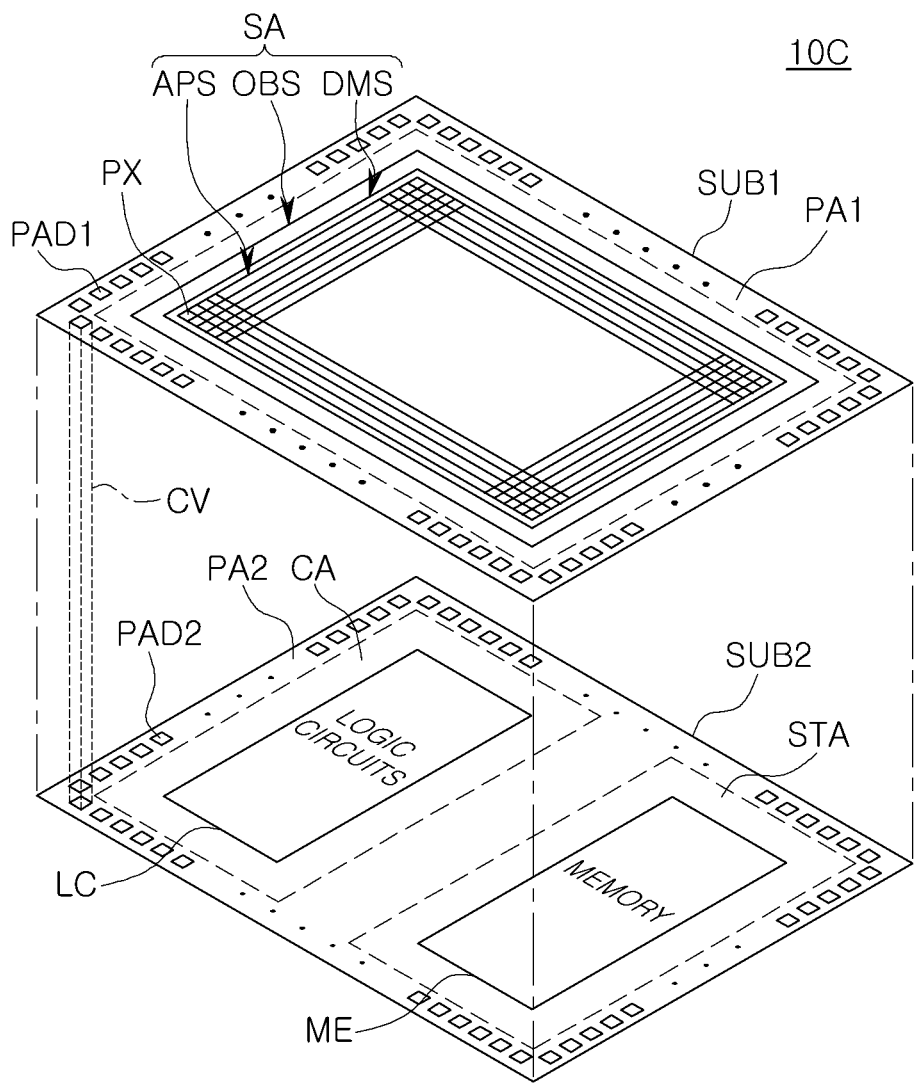
Figure 15C:
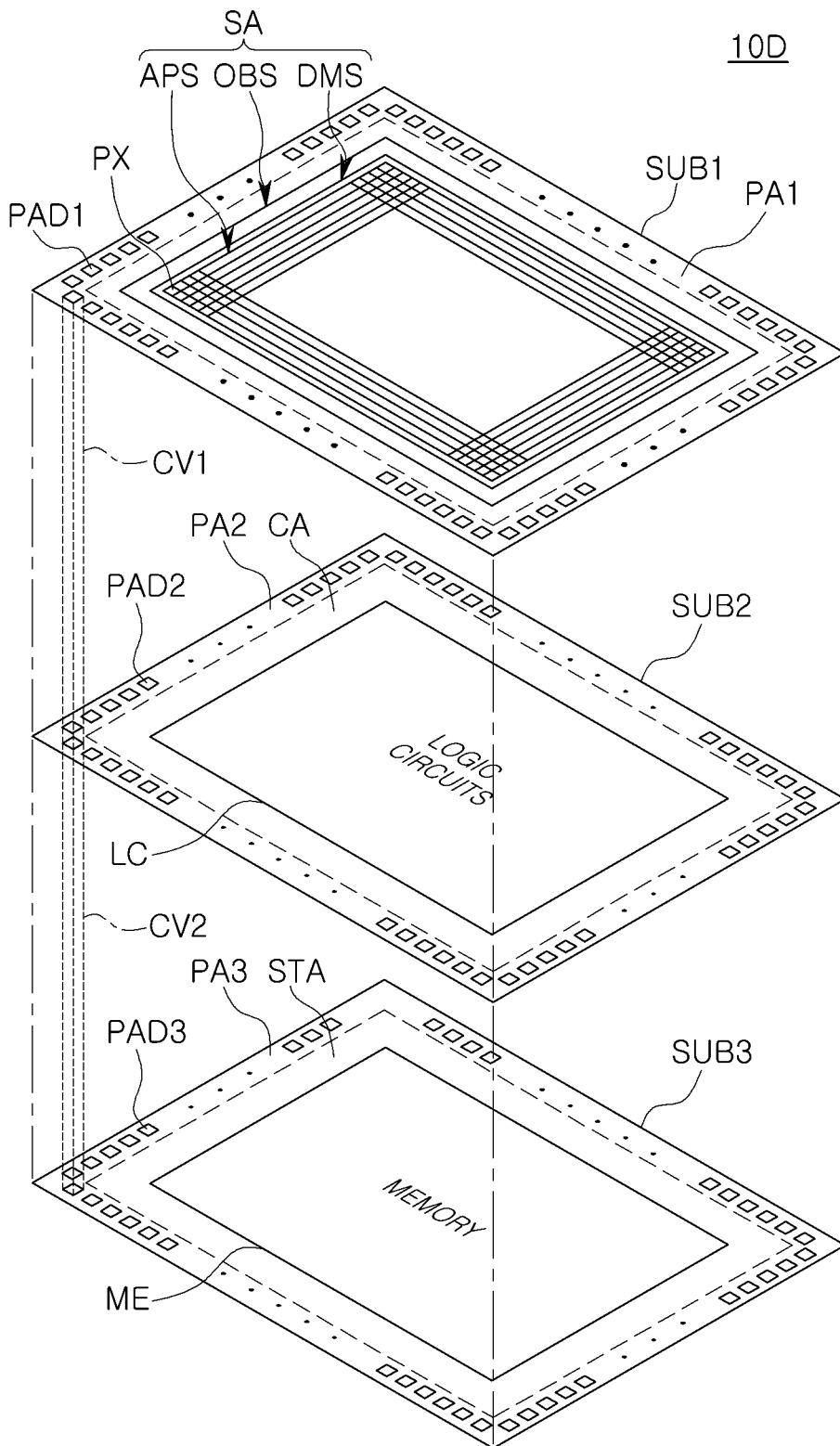

FIGS. 15A to 15C are diagrams illustrating schematic layouts of image sensors according to exemplary embodiments of the present inventive concept.

Referring to FIG. 15A, an image sensor 10B may be a stacked image sensor including a first substrate SUB1 and a second substrate SUB2, stacked in a vertical direction. The first substrate SUB1 may include a sensor array region SA and a first pad area PA1, and the second substrate SUB2 may include a circuit area CA and a second pad area PA2.

The sensor array region SA may include an active pixel sensor area APS, an optical black sensor area OBS, and a dummy pixel sensor area DMS, as described above with reference to FIG. 2. A plurality of first pads PAD1 of the first pad area PA1 may be configured to transmit/receive electrical signals to/from an external device.

The circuit area CA may include a logic circuit block LC, and the circuit area CA may include a plurality of CMOS transistors, as described above with reference to FIG. 2. The circuit area CA may supply a constant signal to each pixel area PX of the sensor array region SA, or control an output signal output from each pixel area PX.

The first pads PAD1 of the first pad area PA1 may be electrically connected to second pads PAD2 of the second pad area PA2 by a connection part CV. However, the arrangement of the connection part CV is not limited thereto, and may be modified in various example embodiments of the present inventive concept.

Referring to FIG. 15B, a second substrate SUB2 of an image sensor 10C may further include a storage area STA. The storage area STA may include a memory block ME. The memory block ME may be electrically connected to a logic circuit block LC to transmit and receive image data. The memory block ME may include a memory device, such as a dynamic random access memory (DRAM) device, a static random access memory (SRAM) device, a spin transfer torque magnetic random access memory (STT-MRAM) device, and a flash memory device.

Referring to FIG. 15C, an image sensor 10D may be a stacked image sensor including a first substrate SUB1, a second substrate SUB2, and a third substrate SUB3, sequentially stacked in a vertical direction. That is, the image sensor 10D according to the example embodiment of the present inventive concept may further include the third substrate SUB3, unlike the image sensors 10B and 10C illustrated in FIGS. 15A and 15B.

The first substrate SUB1 and the second substrate SUB2 may be the same as those described above with reference to FIG. 15A, and the third substrate SUB3 may include a storage area STA and a third pad area PA3. The storage area STA may include a memory block ME, and the memory block ME may include a memory device, as described above with reference to FIG. 15B. In some example embodiments, the first to third substrates SUB1, SUB2, and SUB3 may be a structure based on a semiconductor wafer. In some example embodiments, the first and second substrates SUB1 and SUB2 may be a structure based on a semiconductor wafer, and the third substrate SUB3 may be a structure including a semiconductor chip.

First pads PAD1 of the first pad area PA1 may be electrically connected to second pads PAD2 of the second pad area PA2 by a first connection part CV1. Third pads PAD3 of the third pad area PA3 may be electrically connected to the second pads PAD2 of the second pad area PA2 by a second connection part CV2. However, the arrangement of the first and second connection parts CV1 and CV2 is not limited thereto, and may be modified in various example embodiments of the present inventive concept. For example, in some example embodiments, the first and second connection parts CV1 and CV2 may be arranged in different areas in vertical directions, respectively.

Figure 16:
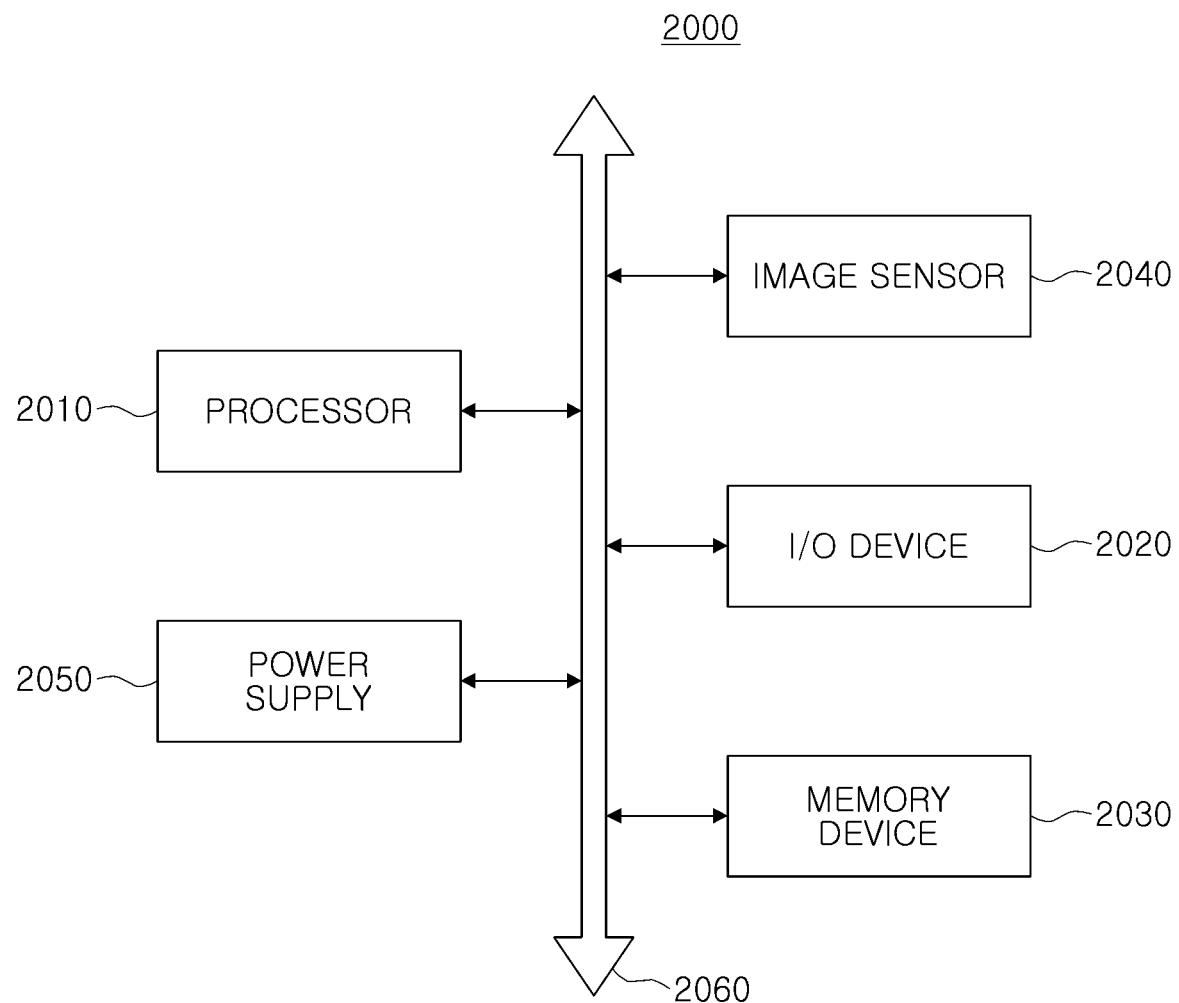
FIG. 16 is a block diagram illustrating a system including an image sensor according to an exemplary embodiment of the present inventive concept.

FIG. 16 is a block diagram illustrating a system including an image sensor according to example embodiments of the present inventive concept.

Referring to FIG. 16, a system 2000 may be one of a computing system, a camera system, a scanner, a car navigation system, a videophone, a security system, and a motion detection system, which require image data.

The system 2000 may include a processor 2010, an input/output (I/O) device 2020, a memory device 2030, an image sensor 2040, and a power supply 2050. The system 2000 may further include ports to communicate with a video card, a sound card, a memory card, a USB device, or other electronic devices.

The processor 2010 may perform particular calculations or tasks. In some example embodiments, the processor 2010 may be a microprocessor or a central processing unit (CPU). The processor 2010 may communicate with the I/O device 2020, the memory device 2030, and the image sensor 2040 through a bus 2060. In some example embodiments, the processor 2010 may be connected to an extended bus such as a peripheral component interconnect (PCI) bus.

The image sensor 2040 may be implemented according to the example embodiments described above with reference to FIGS. 1 to 15C. The I/O device 2020 may include an input device such as a keyboard, a keypad, or a mouse, and an output device such as a printer or a display. The memory device 2030 may store data for operating the system 2000. For example, the memory device 2030 may be a DRAM, a mobile DRAM, an SRAM, a phase-change RAM (PRAM), a ferroelectric RAM (FRAM), a resistive RAM (RRAM), and/or a magnetic RAM (MRAM). The system 2000 may further include a storage device, such as a solid state drive (SSD), a hard disk drive (HDD), or a compact disk-read only memory (CD-ROM). The power supply 2050 may supply an operating voltage for operating the system 2000.

As set forth above, since a seam may be formed at edge areas of electrodes, an image sensor having improved reliability may be provided.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What claimed is:
1. An image sensor, comprising:
a substrate having a first surface and a second surface opposing to the first surface;
a photodiode formed in the substrate;
an organic photoelectric conversion layer;
a pixel electrode disposed between the organic photoelectric conversion layer and the first surface of the substrate;
a first plug extending from the pixel electrode, wherein the first plug is connected to the pixel electrode;
a first via penetrating the substrate, wherein the first via is connected to the first plug; and
an interconnection layer disposed in an interlayer insulating layer, wherein the interlayer insulating layer is disposed on the second surface of the substrate, wherein electric charges generated in the organic photoelectric conversion layer flow to the interconnection layer through the first plug and the first via.

2. The image sensor of claim 1, wherein at least a portion of the first plug is disposed on the first surface of the substrate.

3. The image sensor of claim 1, wherein at least a portion of the first plug has a decreasing width from the pixel electrode toward the first via.

4. The image sensor of claim 1, further comprising:
a capping insulating layer under the pixel electrode,
wherein a lower surface of the pixel electrode is coplanar with an upper surface of the capping insulating layer.

5. The image sensor of claim 1, wherein further comprising:
an interconnection via connected to the interconnection layer and a storage node in the substrate.

6. The image sensor of claim 5, wherein the interconnection via has a cylindrical shape.

7. The image sensor of claim 6, wherein the interconnection via is disposed to be perpendicular to the second surface of the substrate.

8. The image sensor of claim 5, wherein the pixel electrode is electrically connected to the storage node through the first plug, the first via, the interconnection layer, and the interconnection via.

9. The image sensor of claim 5, wherein the interconnection via is disposed on an upper surface of the interconnection layer.

10. The image sensor of claim 5, wherein the storage node is laterally spaced apart from the photodiode.

11. The image sensor of claim 1, further comprising:
an electrode insulating layer surrounding lateral surfaces of the pixel electrode.

12. The image sensor of claim 11, wherein the electrode insulating layer has a decreasing width from a lower surface thereof toward an upper surface thereof.

13. An image sensor, comprising:
a substrate having a first surface and a second surface opposing to the first surface;
a photodiode formed in the substrate;
an organic photoelectric conversion layer;
a pixel electrode disposed between the organic photoelectric conversion layer and the first surface of the substrate;
a first plug extending from the pixel electrode, wherein the first plug is connected to the pixel electrode;
a first via penetrating the substrate, wherein the first via is connected to the first plug; and
an interconnection layer disposed in an interlayer insulating layer and connected to the first via, wherein the interlayer insulating layer is disposed on the second surface of the substrate.

14. The image sensor of claim 13, wherein at least a portion of the first plug is disposed on the first surface of the substrate.

15. The image sensor of claim 13, further comprising:
a via insulating layer surrounding the first via in the substrate.

16. The image sensor of claim 13, wherein the pixel electrode is electrically connected to the interconnection layer through the first plug and the first via.

17. The image sensor of claim 13, wherein the first via is disposed on an upper surface of the interconnection layer.

18. The image sensor of claim 13, wherein at least a portion of the first plug has a decreasing width from the pixel electrode toward the first via.

19. The image sensor of claim 13, wherein further comprising:
an interconnection via connected to the interconnection layer and a storage node in the substrate.

20. The image sensor of claim 19, wherein the interconnection via is disposed on an upper surface of the interconnection layer.

* * * * *